United States Patent
Heo et al.

(10) Patent No.: US 11,302,747 B2
(45) Date of Patent: Apr. 12, 2022

(54) DISPLAY DEVICE

(71) Applicant: Samsung Display Co., Ltd., Yongin-si (KR)

(72) Inventors: Eui Kang Heo, Seoul (KR); Chong Sup Chang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 50 days.

(21) Appl. No.: 17/000,031

(22) Filed: Aug. 21, 2020

(65) Prior Publication Data

US 2021/0159268 A1   May 27, 2021

(30) Foreign Application Priority Data

Nov. 26, 2019   (KR) .......................... 10-2019-0153385

(51) Int. Cl.
*H01L 27/15* (2006.01)
*H01L 27/32* (2006.01)
(Continued)

(52) U.S. Cl.
CPC ........ *H01L 27/156* (2013.01); *H01L 27/3246* (2013.01); *H01L 27/3276* (2013.01);
(Continued)

(58) Field of Classification Search
CPC ............... H01L 27/156; H01L 27/3246; H01L 27/3276; H01L 33/387; H01L 33/486; H01L 33/62; H01L 25/167; H01L 33/60; H01L 25/048; H01L 25/0753; H01L 27/3248; H01L 27/3258; H01L 51/5262; H01L 51/5271; H01L 27/3262; H01L 27/3272; H01L 27/3279; H01L 21/76895; H01L 27/124; H01L 33/005; H01L 33/02; H01L 2224/0344
See application file for complete search history.

(56) References Cited

U.S. PATENT DOCUMENTS 9,076,739 B2 *   7/2015   Choi ................... H01L 27/3246
10,135,014 B2 *  11/2018  Nishinohara ....... H01L 27/3276
(Continued)

FOREIGN PATENT DOCUMENTS

CN   106941113 A   7/2017
CN   107680960 A   2/2018
(Continued)

*Primary Examiner* — Victor A Mandala
(74) *Attorney, Agent, or Firm* — Lewis Roca Rothgerber Christie LLP

(57) ABSTRACT

A display device includes a substrate, a first inner bank and a second inner bank on the substrate and spaced apart from each other, a first electrode on the first inner bank and a second electrode on the second inner bank, and a light emitting element between the first inner bank and the second inner bank, the light emitting element being electrically coupled to the first electrode and the second electrode, wherein the first inner bank comprises a first side surface facing the second inner bank, the second inner bank comprises a second side surface facing the first side surface, and the first side surface and the second side surface are respectively recessed into the first inner bank and the second inner bank, to have a curved shape.

22 Claims, 25 Drawing Sheets

(51) Int. Cl.
  *H01L 33/38* (2010.01)
  *H01L 33/48* (2010.01)
  *H01L 33/62* (2010.01)
(52) U.S. Cl.
  CPC .......... *H01L 33/387* (2013.01); *H01L 33/486* (2013.01); *H01L 33/62* (2013.01)

(56) References Cited

U.S. PATENT DOCUMENTS

| | | | |
|---|---|---|---|
| 11,004,892 B2* | 5/2021 | Kim | H01L 33/504 |
| 11,088,212 B2* | 8/2021 | Yang | H01L 27/3246 |
| 2013/0214302 A1 | 8/2013 | Yeh et al. | |
| 2018/0090058 A1 | 3/2018 | Chen et al. | |
| 2020/0126960 A1* | 4/2020 | Jeong | H01L 25/167 |
| 2020/0168637 A1* | 5/2020 | Kim | H01L 27/3248 |
| 2020/0403029 A1 | 12/2020 | Kim et al. | |
| 2021/0167253 A1* | 6/2021 | Basrur | H01L 33/005 |
| 2021/0202450 A1* | 7/2021 | Min | H01L 25/0753 |
| 2021/0217739 A1* | 7/2021 | Lee | H01L 33/50 |
| 2021/0242380 A1* | 8/2021 | Kim | H01L 33/38 |
| 2021/0265324 A1* | 8/2021 | Kong | H01L 25/167 |
| 2021/0272937 A1* | 9/2021 | Lim | H01L 25/0753 |
| 2021/0288217 A1* | 9/2021 | Li | H01L 33/20 |
| 2021/0296550 A1* | 9/2021 | Li | H01L 27/156 |
| 2021/0305222 A1* | 9/2021 | Min | H01L 33/405 |
| 2021/0343783 A1* | 11/2021 | Choi | H01L 33/36 |
| 2021/0343784 A1* | 11/2021 | Kwag | H01L 27/156 |
| 2021/0351171 A1* | 11/2021 | Yoo | H01L 33/18 |
| 2021/0359165 A1* | 11/2021 | Im | H01L 25/167 |
| 2021/0359166 A1* | 11/2021 | Jung | H01L 33/005 |

FOREIGN PATENT DOCUMENTS

| | | |
|---|---|---|
| EP | 3270424 A1 | 1/2018 |
| EP | 3608958 A1 | 2/2020 |
| KR | 10-2019-0055612 A | 5/2019 |
| KR | 10-2019-0067296 A | 6/2019 |
| KR | 10-2020-0123900 A | 11/2020 |

* cited by examiner

FIG. 1
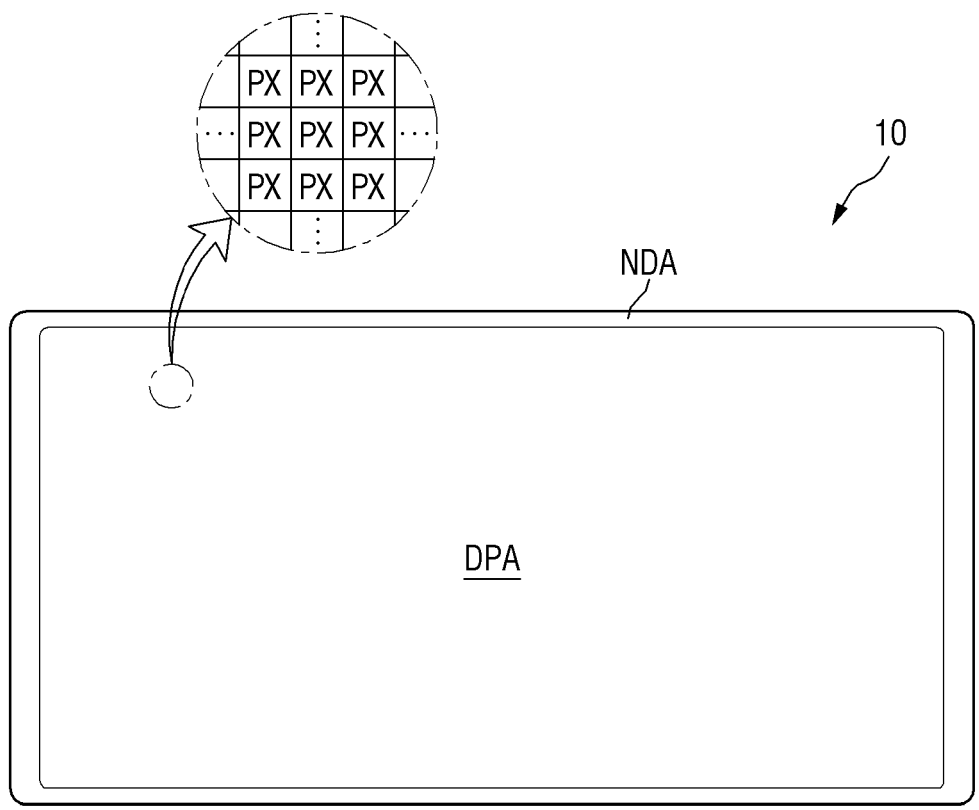
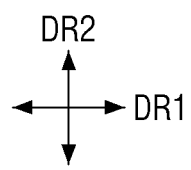

DISPLAY DEVICE

CROSS-REFERENCE TO RELATED APPLICATION

This application claims priority to and the benefit of Korean Patent Application No. 10-2019-0153385, filed on Nov. 26, 2019 in the Korean Intellectual Property Office, the entire content of which is incorporated herein by reference.

BACKGROUND

1. Field

Embodiments of the present disclosure relate to a display device.

2. Description of the Related Art

Display devices are becoming increasingly important and in demand with the development of multimedia. Accordingly, various types of display devices, such as organic light emitting displays and liquid crystal displays, are being used.

A display device is a device for displaying an image, and includes a display panel, such as an organic light emitting display panel and/or a liquid crystal display panel. As a light emitting display panel, the display panel may include light emitting elements such as light emitting diodes (LEDs). For example, the LEDs may be organic light emitting diodes (OLEDs) that use an organic material as a fluorescent material, or may be inorganic LEDs that use an inorganic material as the fluorescent material.

SUMMARY

One or more aspects of embodiments of the present disclosure provide a display device including inner banks having curved side surfaces.

One or more aspects of embodiments of the present disclosure also provide a display device having improved efficiency of light emitted from light emitting elements.

However, aspects and embodiments of the present disclosure are not restricted to the ones set forth herein. The above and other aspects and embodiments of the present disclosure will become more apparent to one of ordinary skill in the art to which the present disclosure pertains by referencing the detailed description of the present disclosure given below.

According to an example embodiment of the present disclosure, a display device comprises a substrate, a first inner bank and a second inner bank, each on the substrate, and spaced apart from each other, a first electrode on the first inner bank and a second electrode on the second inner bank, and a light emitting element between the first inner bank and the second inner bank and electrically coupled to the first electrode and the second electrode, wherein the first inner bank comprises a first side surface facing the second inner bank, the second inner bank comprises a second side surface facing the first side surface, and the first side surface and the second side surface are respectively recessed into the first inner bank and the second inner bank to have a curved shape.

In an example embodiment, the first side surface of the first inner bank may comprise a first end portion contacting a lower surface of the first inner bank and a second end portion contacting an upper surface of the first inner bank, and the first side surface may be below a reference line connecting the first end portion and the second end portion.

In an example embodiment, a slope of the first side surface may vary from the lower surface toward the upper surfaces of the first inner bank, and a slope of the second side surface may vary from a lower surface toward an upper surface of the second inner bank.

In an example embodiment, a first inclination angle between the lower surface of the first inner bank and a line tangent to the first end portion may be smaller than a second inclination angle between the upper surface of the first inner bank and a line tangent to the second end portion.

In an example embodiment, a sum of the first inclination angle and a fourth inclination angle between the upper surface of the first inner bank and the first side surface may be smaller than 180 degrees.

In an example embodiment the first side surface and the second side surface may be respectively recessed toward midpoints of lower portions of the first inner bank and the second inner bank to have a curved shape.

In an example embodiment, the display device may further comprise a first planarization layer on the substrate, wherein the first inner bank and the second inner bank are directly on the first planarization layer.

In an example embodiment, a portion of the first planarization which is located between the first inner bank and the second inner bank may be recessed, and the display device may further comprise a first insulating layer directly on the recessed portion of the first planarization layer.

In an example embodiment, a height of the first inner bank may be smaller than a distance from a lower surface of the first insulating layer to an upper surface of the first inner bank.

In an example embodiment, the light emitting element may be lower than the lower surface of the first inner bank.

In an example embodiment, the display device may further comprise an outer bank spaced apart from the first inner bank and the second inner bank and surrounding the first inner bank and the second inner bank, wherein a height of the outer bank is greater than that of the first inner bank.

In an example embodiment, the display device may further comprise a first contact electrode contacting an end portion of the light emitting element and the first electrode and a second contact electrode contacting another end portion of the light emitting element and the second electrode.

According to another example embodiment of the present disclosure, a first substrate, a bank layer on the first substrate and comprising a groove formed by recessing at least a portion of the bank layer, and a first inner bank and a second inner bank spaced apart from each other with respect to the groove, a first electrode on the first inner bank, a second electrode on the second inner bank, and a light emitting element in the groove and electrically coupled to the first electrode and the second electrode, wherein a first side surface of the first inner bank and a second side surface of the second inner bank may form sides of the groove, and the first side surface and the second side surface are respectively recessed into the first inner bank and the second inner bank, to have a curved shape.

In an example embodiment, the first side surface of the first inner bank may comprise a first end portion contacting a lower surface of the first inner bank and a second end portion contacting an upper surface of the first inner bank, and the first side surface may be below a reference line connecting the first end portion and the second end portion.

In an example embodiment, a depth of the groove may be smaller than a height of the first inner bank.

In an example embodiment, the display device may further comprise a first interlayer insulating layer between the first substrate and the bank layer; and a second interlayer insulating layer between the first interlayer insulating layer and the bank layer, wherein the bank layer is directly on the second interlayer insulating layer.

In an example embodiment, the groove may penetrate the second interlayer insulating layer to expose an upper surface of the first interlayer insulating layer, and the depth of the groove may be greater than the height of the first inner bank.

In an example embodiment, a lower surface of the groove may be a flat surface.

In an example embodiment, the lower surface of the groove may contact an upper surface of the second interlayer insulating layer, and the depth of the groove may be substantially equal to the height of the first inner bank.

In an example embodiment, the light emitting element may be located on the same layer as the second interlayer insulating layer.

In an example embodiment, the lower surface of the groove may have a curved shape.

In an example embodiment, the first side surface and the second side surface may be respectively recessed toward midpoints of lower portions of the first inner bank and the second inner bank to have a curved shape.

BRIEF DESCRIPTION OF THE DRAWINGS

These and/or other aspects will become apparent and more readily appreciated from the following description of the embodiments, taken in conjunction with the accompanying drawings in which:

FIG. 1 is a plan view of a display device according to an embodiment;

DETAILED DESCRIPTION

Figure 2:
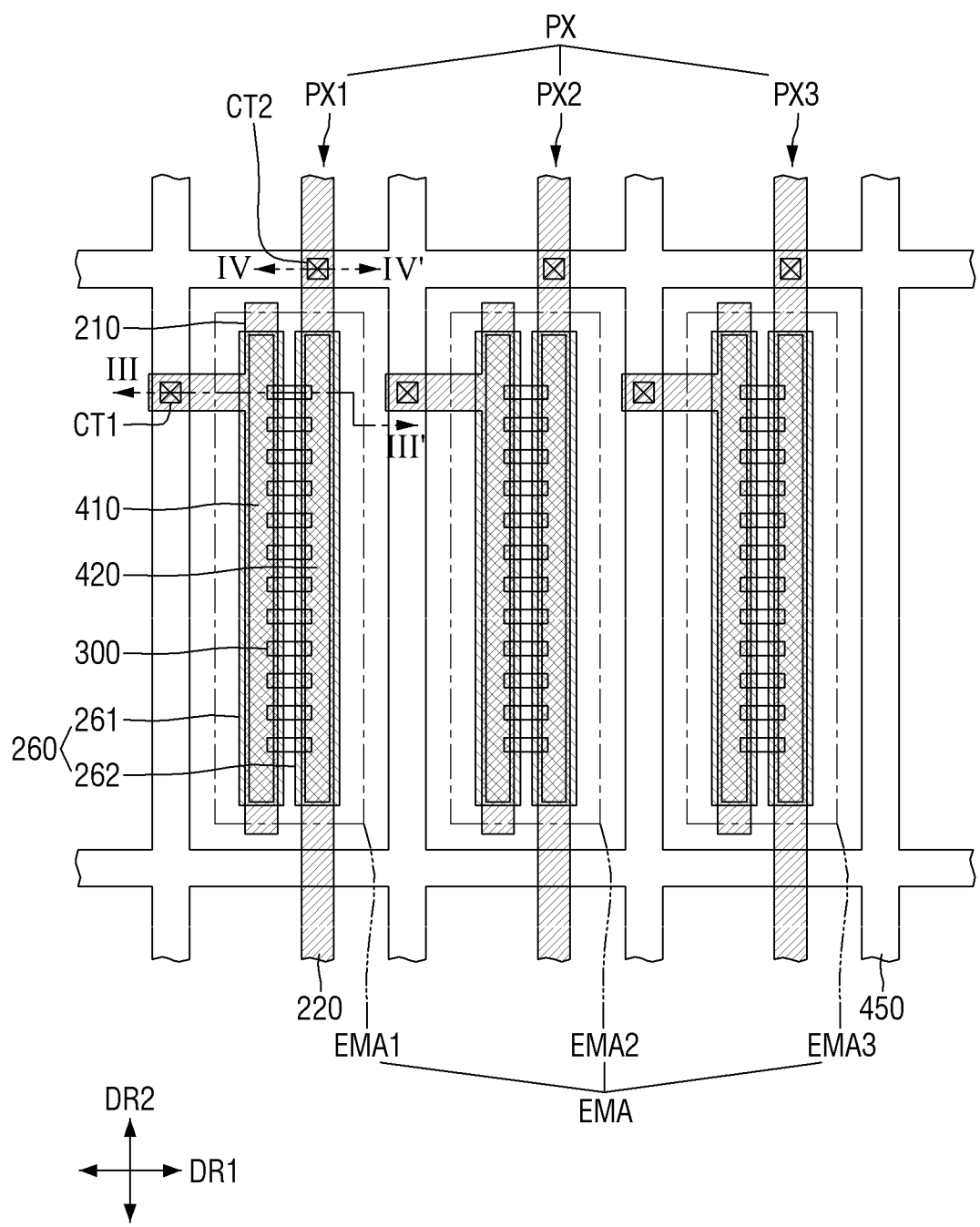
FIG. 2 is a plan view of a pixel of a display device according to an embodiment.

Embodiments of the present disclosure will now be described more fully hereinafter with reference to the accompanying drawings, in which example embodiments of the present disclosure are shown. The subject matter of this disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate (without any intervening layers therebetween), or intervening layers may also be present. The same reference numbers indicate the same components throughout the specification and drawings.

It will be understood that, although the terms "first," "second," etc. may be used herein to describe various elements, these elements should not be limited by these terms. These terms are only used to distinguish one element from another element. For instance, a first element discussed below could be termed a second element, without departing from the teachings of the present disclosure. Similarly, the second element could also be termed the first element.

Hereinafter, embodiments will be described with reference to the attached drawings.

FIG. 1 is a schematic plan view of a display device 10 according to an embodiment.

Referring to FIG. 1, the display device 10 can display moving images and/or still images. The display device 10 may refer to any suitable electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 includes a display panel that provides a display screen. Examples of the display panel include inorganic light emitting diode (LED) display panels, organic light emitting display panels, quantum dot light emitting display panels, plasma display panels, and field emission display panels. A case where an inorganic LED display panel is applied as an example of the display panel of the present embodiments will be described below, but embodiments are not limited to this case, and other suitable display panels can also be applied, as long as substantially the same technical spirit is applicable.

The shape of the display device 10 can be variously modified. For example, the display device 10 may have various suitable shapes, such as a horizontally long rectangle, a vertically long rectangle, a square, a quadrilateral with rounded corners (vertices), other polygons, and/or a circle. The shape of a display area DPA of the display device 10 may also be similar to the overall shape of the display device 10. In FIG. 1, each of the display device 10 and the display area DPA is shaped as a horizontally long rectangle, but the present disclosure is not limited thereto.

The display device 10 may include the display area DPA and a non-display area NDA. The display area DPA may be an area where a screen (e.g., an image) can be displayed, and the non-display area NDA may be an area where no screen (e.g., no image) is displayed. The display area DPA may also be referred to as an active area, and the non-display area NDA may also be referred to as an inactive area. The display area DA may generally occupy a center of the display device 10 (e.g., may be substantially in the center of the display device 10).

The display area DA may include a plurality of pixels PX. The pixels PX may be arranged in a matrix direction (e.g., in a matrix configuration). Each of the pixels PX may be rectangular or square in plan view. However, the shape of each of the pixels PX is not limited to these examples, and may also be a rhombic shape having each side inclined with respect to a direction (e.g., with respect to horizontal and vertical directions). The pixels PX may be alternately arranged in a stripe or pentile pattern. Each of the pixels PX may include one or more light emitting elements 300, which emit light of a set or specific wavelength band to display a set or specific color.

The non-display area NDA may be around the display area DPA. The non-display area NDA may completely or partially surround the display area DPA. The display area DPA may be rectangular, and the non-display area NDA may be adjacent to four sides of the rectangular display area DPA. The non-display area NDA may form a bezel of the display device 10. In each non-display area NDA, wirings and/or circuit drivers included in the display device 10 may be arranged, and/or external devices may be mounted.

Figure 3:
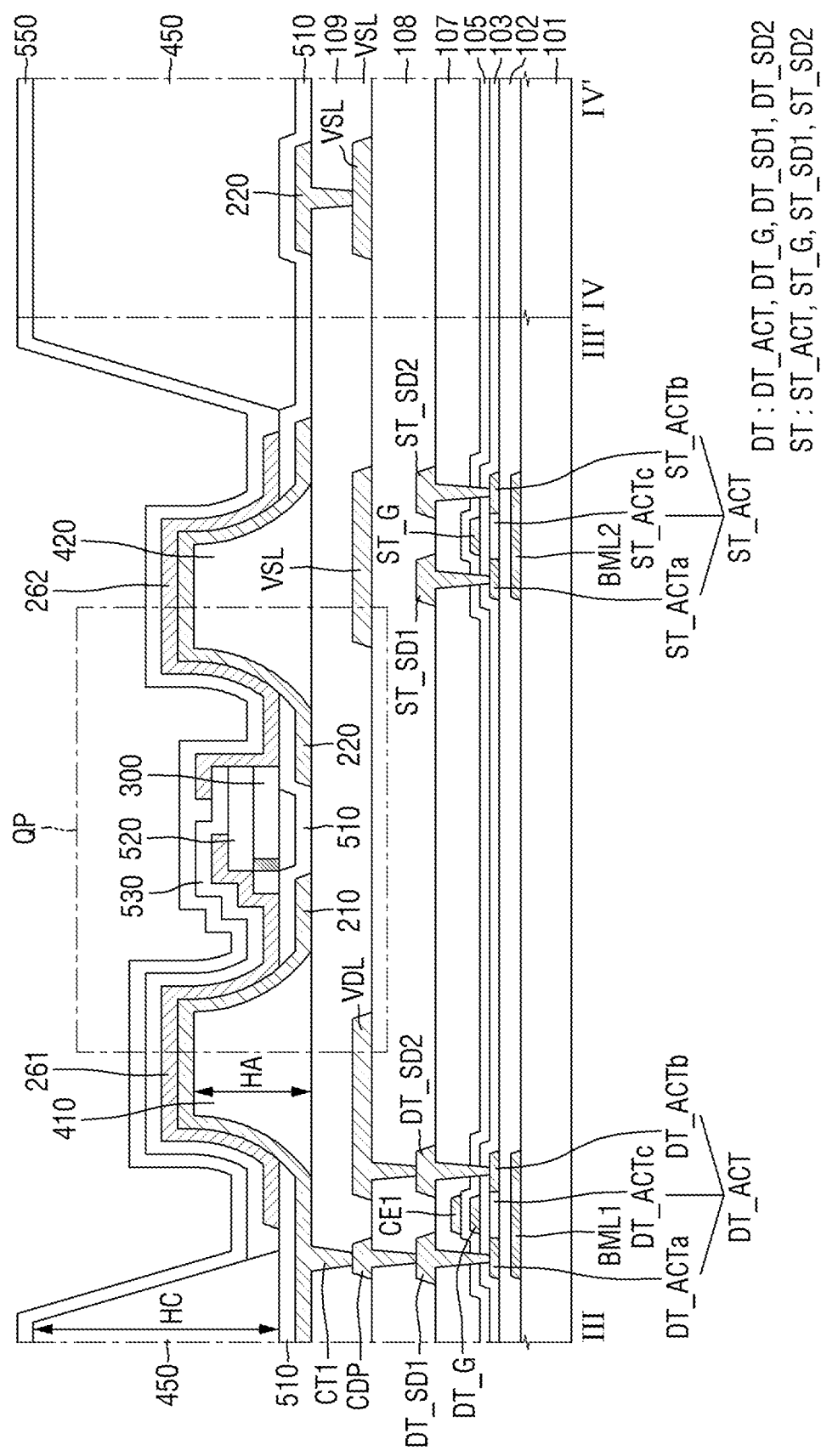
FIG. 3 is a cross-sectional view taken along line III-III' of FIG. 2.

FIG. 2 is a plan view of a pixel PX of the display device 10 according to an embodiment. FIG. 3 is a cross-sectional view taken along line III-III' of FIG. 2.

Each of the pixels PX may include one or more subpixels PXn. Referring to FIGS. 2 and 3, each of the pixels PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. The first color may be blue, the second color may be green, and the third color may be red. However, embodiments are not limited to this case, and the subpixels PXn may also emit light of the same color. In addition, although one pixel PX including three subpixels PXn is illustrated in FIG. 2, embodiments of the present disclosure are not limited to this case, and the pixel PX may also include more than three subpixels PXn.

Each subpixel PXn of the display device 10 may include an area defined as an emission area EMA. The first subpixel PX1 may include a first emission area EMA1, the second subpixel PX2 may include a second emission area EMA2, and the third subpixel PX3 may include a third emission area EMA3. The emission area EMA may be defined as an area where light emitting elements 300 included in the display device 10 are arranged to output light of a set or specific wavelength band. Each of the light emitting elements 300 may include an active layer 330 (see FIG. 7), and the active layer 330 may emit light of a set or specific wavelength in any direction. Light emitted from the active layer 330 of each light emitting element 300 may be radiated not only toward both ends of the light emitting element 300 (e.g., in a longitudinal direction of the light emitting element 300), but also in a lateral direction of the light emitting element 300. The emission area EMA may include an area where the light emitting elements 300 are arranged and where light emitted from the light emitting elements 300 is output to an area adjacent to the light emitting elements 300.

However, embodiments are not limited to this case, and the emission area EMA may also include an area where light emitted from the light emitting elements 300 is output after being reflected or refracted by other members. A plurality of light emitting elements 300 may be provided in each subpixel PXn, and an area where the light emitting elements 300 are provided and an area adjacent thereto may together form the emission area EMA.

In some embodiments, each subpixel PXn of the display device 10 may include a non-emission area defined as an area other than the emission area EMA. The non-emission area may be an area in which the light emitting elements 300 are not provided, and from which no light is output because light emitted from the light emitting elements 300 does not reach this area.

FIG. 3 illustrates a cross section of only the first subpixel PX1 of FIG. 2, but the same illustration may apply to other pixels PX and/or subpixels PXn. FIG. 3 illustrates a cross section from one end to another end of a light emitting element 300 positioned in the first subpixel PX1 of FIG. 2.

The display device 10 may include a circuit element layer and a display element layer provided on a first substrate 101. A semiconductor layer, a plurality of conductive layers, and a plurality of insulating layers may be provided on the first substrate 101 and may constitute the circuit element layer and the display element layer. The plurality of conductive layers may include a first gate conductive layer, a second gate conductive layer, a first data conductive layer, and a second data conductive layer, which are arranged under a first planarization layer 109 and constitute the circuit element layer, and electrodes 210 and 220 and contact electrodes 260, which are arranged on the first planarization layer 109 and constitute the display element layer. The plurality of insulating layers may include a buffer layer 102, a first gate insulating layer 103, a first protective layer 105, a first interlayer insulating layer 107, a second interlayer insulating layer 108, the first planarization layer 109, a first insulating layer 510, a second insulating layer 520, a third insulating layer 530, and a fourth insulating layer 550.

The circuit element layer may include a driving transistor DT, a switching transistor ST, a first conductive pattern CDP, and a plurality of voltage wirings VDL and VSL as circuit elements and wirings for driving the light emitting elements 300; and the display element layer may include a first electrode 210, a second electrode 220, a first contact electrode 261, and a second contact electrode 262, as well as the light emitting elements 300.

The first substrate 101 may be an insulating substrate. The first substrate 101 may be made of an insulating material such as glass, quartz, and/or polymer resin. In some embodiments, the first substrate 101 may be a rigid substrate, but may also be a flexible substrate that can be bent, folded, and/or rolled.

Light blocking layers BML1 and BML2 may be provided on the first substrate 101. The light blocking layers BML1 and BML2 may include a first light blocking layer BML1 and a second light blocking layer BML2. The first light blocking layer BML1 and the second light blocking layer BML2 are overlapped by at least a first active material layer DT_ACT of the driving transistor DT and a second active material layer ST_ACT of the switching transistor ST, respectively. The light blocking layers BML1 and BML2 may each independently include a light blocking material to prevent or reduce light from entering the first and second active material layers DT_ACT and ST_ACT. For example, the first and second light blocking layers BML1 and BML2 may each independently be made of an opaque metal material that blocks or substantially reduces transmission of light. In some cases, the light blocking layers BML1 and BML2 may be omitted. In some embodiments, the first light blocking layer BML1 may be electrically coupled to a first source/drain electrode DT_SD1 of the driving transistor DT, to be described in more detail herein below, and the second light blocking layer BML2 may be electrically coupled to a first source/drain electrode ST_SD1 of the switching transistor ST. As used herein, the expression "first source/drain electrode" refers to a first source electrode or a first drain electrode.

The buffer layer 102 may be arranged on the entire surface of the first substrate 101 having the light blocking layers BML1 and BML2. The buffer layer 102 may be formed on the first substrate 101 to protect the transistors DT and ST of each pixel PX from moisture that may be introduced through the first substrate 101, which is vulnerable to moisture penetration, and may perform a surface planarization function. The buffer layer 102 may be composed of a plurality of inorganic layers stacked alternately. For example, the buffer layer 102 may be formed as a multilayer in which one or more inorganic layers selected from a silicon oxide (SiOx) layer, a silicon nitride (SiNx) layer, and silicon oxynitride (SiON) layer are alternately stacked.

The semiconductor layer may be on the buffer layer 102. The semiconductor layer may include the first active material layer DT_ACT of the driving transistor DT and the second active material layer ST_ACT of the switching transistor ST. The first and second active material layers DT_ACT and ST_ACT may be respectively partially overlapped by gate electrodes DT_G and ST_G of the first gate conductive layer, which will be described in more detail herein below.

In an example embodiment, the semiconductor layer may include polycrystalline silicon, monocrystalline silicon, an oxide semiconductor, and/or the like. The polycrystalline silicon may be formed, for example, by crystalizing amorphous silicon. Non-limiting examples of the crystallization method include rapid thermal annealing (RTA), solid phase crystallization (SPC), excimer laser annealing (ELA), metal induced crystallization (MIC), and sequential lateral solidification (SLS). When the semiconductor layer includes polycrystalline silicon, the first active material layer DT_ACT may include a first doping region DT_ACTa, a second doping region DT_ACTb, and a first channel region DT_ACTc. The first channel region DT_ACTc may be between the first doping region DT_ACTa and the second doping region DT_ACTb. The second active material layer ST_ACT may include a third doping region ST_ACTa, a fourth doping region ST_ACTb, and a second channel region ST_ACTc. The second channel region ST_ACTc may be between the third doping region ST_ACTa and the fourth doping region ST_ACTb. The first doping region DT_ACTa, the second doping region DT_ACTb, the third doping region ST_ACTa, and the fourth doping region ST_ACTb may be regions of the first active material layer DT_ACT and the second active material layer ST_ACT, respectively, which are doped with impurities.

In an example embodiment, the first active material layer DT_ACT and the second active material layer ST_ACT may include an oxide semiconductor. In this case, the doping regions of the first active material layer DT_ACT and the second active material layer ST_ACT may be conducting regions. The oxide semiconductor may be an oxide semiconductor containing indium (In). In some embodiments, the oxide semiconductor may be indium-tin oxide (ITO), indium-zinc oxide (IZO), indium-gallium oxide (IGO), indium-zinc-tin oxide (IZTO), indium-gallium-tin oxide (IGTO), and/or indium-gallium-zinc-tin oxide (IGZTO).

The first gate insulating layer 103 may be on the semiconductor layer and the buffer layer 102. The first gate insulating layer 103 may be on the buffer layer 102 having the semiconductor layer. The first gate insulating layer 103 may function as a gate insulating film of each of the driving transistor DT and the switching transistor ST. The first gate insulating layer 103 may be made of an inorganic material such as silicon oxide (SiOx), silicon nitride (SiNx), or a stack structure thereof.

The first gate conductive layer may be on the first gate insulating layer 103. The first gate conductive layer may include a first gate electrode DT_G of the driving transistor DT and a second gate electrode ST_G of the switching transistor ST. The first gate electrode DT_G may overlap at least a portion of the first active material layer DT_ACT, and the second gate electrode ST_G may overlap at least a portion of the second active material layer ST_ACT. For example, the first gate electrode DT_G may overlap the first channel region DT_ACTc of the first active material layer DT_ACT in a thickness direction, and the second gate electrode STG may overlap the second channel region ST_ACTc of the second active material layer ST_ACT in the thickness direction.

The first gate conductive layer may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys thereof.

The first protective layer 105 may be on the first gate conductive layer. The first protective layer 105 may cover the first gate conductive layer to protect the first gate conductive layer. The first protective layer 105 may be made of an inorganic material such as silicon oxide (SiOx), silicon nitride (SiNx), or a stack structure thereof.

The second gate conductive layer may be on the first protective layer 105. The second gate conductive layer may include a first capacitive electrode CE1 of a storage capacitor, at least a portion of which overlaps the first gate electrode DT_G in the thickness direction. The first capacitive electrode CE1 may overlap the first gate electrode DT_G in the thickness direction, with the first protective layer 105 between them, and the storage capacitor may be formed between the first capacitive electrode CE1 and the first gate electrode DT_G. The second gate conductive layer may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys thereof.

The first interlayer insulating layer 107 may be on the second gate conductive layer. The first interlayer insulating layer 107 may function as an insulating film between the second gate conductive layer and other layers on the second gate conductive layer. The first interlayer insulating layer 107 may be made of an inorganic material such as silicon oxide (SiOx), silicon nitride (SiNx), or a stack structure thereof.

The first data conductive layer may be on the first interlayer insulating layer 107. The first data conductive layer may include the first source/drain electrode DT_SD1 and a second source/drain electrode DT_SD2 of the driving transistor DT, and the first source/drain electrode ST_SD1 and a second source/drain electrode ST_SD2 of the switching transistor ST.

The first source/drain electrode DT_SD1 and the second source/drain electrode DT_SD2 of the driving transistor DT may respectively contact the first doping region DT_ACTa and the second doping region DT_ACTb of the first active material layer DT_ACT through contact holes penetrating the first interlayer insulating layer 107 and the first gate insulating layer 103, respectively. The first source/drain electrode ST_SD1 and the second source/drain electrode ST_SD2 of the switching transistor ST may respectively contact the third doping region ST_ACTa and the fourth doping region ST_ACTb of the second active material layer ST_ACT through contact holes penetrating the first interlayer insulating layer 107 and the first gate insulating layer 103, respectively. In some embodiments, the first source/drain electrode DT_SD1 of the driving transistor DT and the first source/drain electrode ST_SD1 of the switching transistor ST may be electrically coupled to the first light blocking layer BML1 and the second light blocking layer BML2 through other contact holes, respectively. When any one of the first source/drain electrode DT_SD1 or ST_SD1, or the second source/drain electrode DT_SD2 or ST_SD2, of each of the driving transistor DT and the switching transistor ST is a source electrode, the other electrode may be a drain electrode. However, embodiments are not limited to this case, and when any one of the first source/drain electrode DT_SD1 or ST_SD1, or the second source/drain electrode DT_SD2 or ST_SD2 is a drain electrode, the other electrode may be a source electrode.

The first data conductive layer may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys thereof.

The second interlayer insulating layer 108 may be on the first data conductive layer. The second interlayer insulating layer 108 may be on the entire surface of the first interlayer insulating layer 107, to cover the first data conductive layer and protect the first data conductive layer. The second interlayer insulating layer 108 may be made of an inorganic material such as silicon oxide (SiOx), silicon nitride (SiNx), or a stack structure thereof.

The second data conductive layer may be on the second interlayer insulating layer 108. The second data conductive layer may include a second voltage wiring VSL, a first voltage wiring VDL, and the first conductive pattern CDP. A high-potential voltage (e.g., a first power supply voltage VDD) supplied to the driving transistor DT may be applied to the first voltage wiring VDL, and a low-potential voltage (e.g., a second power supply voltage VSS) supplied to the second electrode 220 may be applied to the second voltage wiring VSL. An alignment signal needed to align the light emitting elements 300 may also be transmitted to the second voltage wiring VSL during a manufacturing process of the display device 10.

The first conductive pattern CDP may be electrically coupled to the first source/drain electrode DT_SD1 of the driving transistor DT through a contact hole formed in the second interlayer insulating layer 108. The first conductive pattern CDP may also contact the first electrode 210 to be described herein below in more detail, and the driving transistor DT may transfer the first power supply voltage VDD received from the first voltage wiring VDL to the first electrode 210 through the first conductive pattern CDP. Although the second data conductive layer including one second voltage wiring VSL and one first voltage wiring VDL is illustrated in the drawings, embodiments of the present disclosure are not limited to this case. The second data conductive layer may also include a plurality of first voltage wirings VSL and/or a plurality of second voltage wirings VSL.

The second data conductive layer may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys thereof.

The first planarization layer 109 may be on the second data conductive layer. The first planarization layer 109 may include an organic insulating material and may perform a surface planarization function.

Inner banks 410 and 420, a plurality of electrodes 210 and 220, an outer bank 450, a plurality of contact electrodes 260, and the light emitting elements 300 are on the first planarization layer 109. In addition, a plurality of insulating layers 510, 520 530 and 550 may be further provided on the first planarization layer 109.

The inner banks 410 and 420 may be directly on the first planarization layer 109. The inner banks 410 and 420 may include a first inner bank 410 and a second inner bank 420 adjacent to a center of each pixel PX or subpixel PXn.

As illustrated in FIG. 2, the first inner bank 410 and the second inner bank 420 may be spaced apart to face each other in a first direction DR1. The first inner bank 410 and the second inner bank 420 may extend in a second direction DR2, but may end at positions spaced apart from a boundary between subpixels PXn (e.g., may end before reaching a boundary between subpixels PXn), so as not to extend to other subpixels PXn neighboring (e.g., adjacent) in the second direction DR2. Accordingly, the first inner bank 410 and the second inner bank 420 may be arranged in each subpixel PXn so as to form linear patterns on the entire surface of the display deice 10. Because the inner banks 410 and 420 are spaced apart to face each other, an area where the light emitting elements 300 are arranged may be formed between the inner banks 410 and 420. Although one first inner bank 410 and one second inner bank 420 are illustrated in FIG. 3, present embodiments are not limited to this case. In some embodiments, each of the first and second inner banks 410 and 420 may be provided in plural numbers (e.g., in plurality), depending on (e.g., corresponding to) the number of the electrodes 210 and 220, or a larger number of other (e.g., additional) inner banks 410 and 420 may be further provided.

As illustrated in FIG. 3, at least a portion of each of the first inner bank 410 and the second inner bank 420 may protrude from an upper surface of the first planarization layer 109. According to an embodiment, the first inner bank 410 and the second inner bank 420 may protrude upward from the first planarization layer 109, and at least one side surface PS1 or PS2 (see FIG. 4) of each of the first inner bank 410 and the second inner bank 410 may be recessed into a corresponding one of the inner banks 410 and 420 to have a curved (e.g., concave) shape.

An opening area HP (see FIG. 4) may be formed between the first inner bank 410 and the second inner bank 420, and the light emitting elements 300 may be arranged in the opening area HP. The opening area HP may be understood as an area where a portion of the upper surface of the first planarization layer 109 is exposed so that the light emitting elements 300 can be arranged between the first inner bank 410 and the second inner bank 420. The light emitting elements 300 may be electrically coupled to the electrodes 210 and 220 in the opening area HP and may emit light of a set or specific wavelength band. Light emitted from the light emitting elements 300 may travel toward the side surfaces PS1 and PS2 of the inner banks 410 and 420. When the electrodes 210 and 220 on the inner banks 410 and 420 include a material having reflectivity, light emitted from the light emitting elements 300 may be reflected by the electrodes 210 and 220 located on the side surfaces PS1 and PS2 of the inner banks 410 and 420 to travel above (e.g., away from) the first substrate 101. According to an embodiment, the inner banks 410 and 420 may provide an area where the light emitting elements 300 are to be arranged, while functioning as reflective barriers that reflect light emitted from the light emitting elements 300 in an upward direction.

For example, the traveling direction of light reflected after being emitted from the light emitting elements 300 may be determined by the shape of each of the side surfaces PS1 and PS2 of the inner banks 410 and 420. In the display device 10 according to an embodiment, because the side surfaces PS1 and PS2 of the inner banks 410 and 420, which may function as reflective barriers, are recessed to have a curved (e.g., concave) shape, light emitted from the light emitting elements 300 can be concentrated as it is reflected. In an example embodiment, a first side surface PS1 and a second side surface PS2 may respectively be recessed toward midpoints of lower portions of the first inner bank 410 and the second inner bank 420 to have a curved (e.g., concave) shape. Each of the side surfaces PS1 and PS2 of the inner banks 410 and 420 may have a set or specific curvature and may be recessed in a set or specific direction, in order to maximize (or improve) the concentration of light emitted from the light emitting elements 300. For example, each of the first side surface PS1 and the second side surface PS2 may be recessed from a respective reference line connecting both ends of the first side surface PS1 or the second side surface PS2, toward the midpoint of the lower portion of the respective inner bank 410 or 420.

In some embodiments, light emitted from each of the light emitting elements 300 may be output through both end surfaces of the light emitting element 300 (along the first direction DR1). Here, since the side surfaces PS1 and PS2 of the inner banks 410 and 420 have a curved (e.g., concave) shape, the opening area HP, in which the light emitting elements 300 are arranged, may have an overall shape surrounding the light emitting elements 300. Accordingly, most of the light emitted from the light emitting elements 300 may travel toward the side surfaces PS1 and PS2 of the inner banks 410 and 420, and the area that can be reached by the light may increase, thereby increasing the reflectance of the electrodes 210 and 220. For example, the light output efficiency of the display device 10 can be improved by the curved (e.g., concave) shape of each of the side surfaces PS1 and PS2 of the inner banks 410 and 420. Although both side surfaces of each of the inner banks 410 and 420 are illustrated to have a curved shape in the drawings, embodiments of the present disclosure are not limited to this case.

In an example embodiment, the inner banks 410 and 420 may include an organic insulating material such as polyimide (PI). According to an embodiment, the inner banks 410 and 420 may be formed by a patterning process using dry etching, rather than by a patterning process using photoresist, and materials that form the inner banks 410 and 420 may each independently be silicon oxide (SiOx), silicon nitride (SiNx), silicon oxynitride (SiOxNy), and/or an organic insulating material. In the inner banks 410 and 420 formed through a dry etching process, at least the facing (e.g., facing each other) side surfaces PS1 and PS2 may have a curved shape. When the inner banks 410 and 420 include any of the above materials, the first planarization layer 109 and the second interlayer insulating layer 108 positioned under the inner banks 410 and 420 may also include the same material(s) as the inner banks 410 and 420, and may be etched at the same time as the inner banks 410 and 420 in (e.g., utilizing) a dry etching process. In this case, the opening area HP formed between the inner banks 410 and 420 may be deeper.

The electrodes 210 and 220 may be provided on the inner banks 410 and 420 and the first planarization layer 109. The electrodes 210 and 220 may include the first electrode 210 on the first inner bank 410 and the second electrode 220 on the second inner bank 420.

As illustrated in FIG. 2, the first electrode 210 may extend in the second direction DR2 in each subpixel PXn. However, the first electrode 210 may not extend to other subpixels PXn neighboring (e.g., adjacent) in the second direction DR2, but rather may be partially spaced apart from the outer bank 450 surrounding each subpixel PXn. At least a portion of the first electrode 210 may be overlapped by the outer bank 450, and the first electrode 210 may be electrically coupled to the driving transistor DT in an area overlapping the outer bank 450. For example, the first electrode 210 may be formed in the area overlapping the outer bank 450, may contact the first conductive pattern CDP through a first contact hole CT1 penetrating the first planarization layer 109, and may be electrically coupled to the first source/drain electrode DT_SD1 of the driving transistor DT through the first conductive pattern CDP.

The second electrode 220 may extend in the second direction DR2 in each subpixel PXn. Unlike the first electrode 210, the second electrode 220 may extend to other subpixels PXn neighboring (e.g., adjacent) in the second direction DR2. For example, one second electrode 220 may be arranged in a plurality of subpixels PXn neighboring each other in the second direction DR2. The second electrode 220 may be partially overlapped by the outer bank 450 at the boundary of neighboring or adjacent subpixels PXn (e.g., each subpixels PXn neighboring) in the second direction DR2, and may be electrically coupled to the second voltage wiring VSL in an area overlapping the outer bank 450. For example, the second electrode 220 may be formed in the area overlapping the outer bank 450 and may contact the second voltage wiring VSL through a second contact hole CT2 penetrating the first planarization layer 109. The second electrodes 220 of subpixels PXn neighboring (e.g., adjacent to) each other in the first direction DR1 may be electrically coupled to the second voltage wiring VSL through the second contact holes CT2, respectively.

However, present embodiments are not limited to this case. In some embodiments, each of the second electrodes 220 may further include a stem portion extending in the first direction DR1, and the second electrodes 220 of the subpixels PXn neighboring (e.g., adjacent to) each other in the first direction DR1 may be electrically coupled to each other through the stem portions. In this case, the second electrodes 220 may be electrically coupled to the second voltage wiring VSL in the non-display area NDA located around the display area DPA, in which a plurality of pixels PX or subpixels PXn are arranged.

Although the drawings illustrate that one first electrode 210 and one second electrode 220 are provided in each subpixel PXn, present embodiments are not limited to this case. In some embodiments, a plurality of first electrodes 210 and/or a plurality of second electrodes 220 may be provided in each subpixel PXn. In some embodiments, the first electrode 210 and the second electrode 220 in each subpixel PXn may not necessarily extend in one direction and may have various suitable structures. For example, the first electrode 210 and the second electrode 220 may be partially curved or bent, or any one of the first electrode 210 and the second electrode 220 may surround the other electrode. The structure or shape in which the first electrode 210 and the second electrode 220 are provided is not particularly limited as long as the first electrode 210 and the second electrode 220 are at least partially spaced apart to face each other so that an area where the light emitting elements 300 are to be arranged can be formed between the first electrode 210 and the second electrode 220.

The electrodes 210 and 220 may be electrically coupled to the light emitting elements 300 and may receive a set or predetermined voltage, so that the light emitting elements 300 can emit light. For example, the electrodes 210 and 220 may be electrically coupled to the light emitting elements 300 through the contact electrodes 260, and may transmit received electrical signals to the light emitting elements 300 through the contact electrodes 260.

In an example embodiment, the first electrode 210 may be a separate pixel electrode positioned in each subpixel PXn, and the second electrode 220 may be a common electrode integrally provided along a plurality of subpixels PXn. Any one of the first electrode 210 and the second electrode 220 may constitute anodes of the light emitting elements 300, and the other electrode may constitute cathodes of the light emitting elements 300. However, present embodiments are not limited to this case, and the opposite case may also be true.

In some embodiments, each of the electrodes 210 and 220 may be utilized to form an electric field in each subpixel PXn so as to align the light emitting elements 300. The light emitting elements 300 may be placed between the first electrode 210 and the second electrode 220 by a process of forming an electric field between the first electrode 210 and the second electrode 220 that includes transmitting an alignment signal to the first electrode 210 and the second electrode 220. As will be described in more detail herein below, the light emitting elements 300 dispersed in a set or predetermined ink may be sprayed onto the first electrode 210 and the second electrode 220 through an inkjet process, and may be aligned between the first electrode 210 and the second electrode 220 by applying a dielectrophoretic force to the light emitting elements 300 by (while) transmitting an alignment signal between the first electrode 210 and the second electrode 220.

As illustrated in FIG. 3, the first electrode 210 and the second electrode 220 may be on the first inner bank 410 and the second inner bank 420, respectively, and may be spaced apart to face each other in the first direction DR1. The light emitting elements 300 may be between the first inner bank 410 and the second inner bank 420, and at least one end portion of each of the light emitting elements 300 may be electrically coupled to the first electrode 210 and the second electrode 220 at the same time, when the light emitting elements 300 are between the first electrode 210 and the second electrode 220.

In some embodiments, the first electrode 210 and the second electrode 220 may be formed to have greater widths (e.g., in the first direction DR1) than the first inner bank 410 and the second inner bank 420, respectively. For example, the first electrode 210 and the second electrode 220 may cover outer surfaces of the first inner bank 410 and the second inner bank 420, respectively. The first electrode 210 and the second electrode 220 may be arranged on the side surfaces of the first inner bank 410 and the second inner bank 420, respectively, and a gap (in the first direction DR1) between the first electrode 210 and the second electrode 220 may be smaller than a gap between the first inner bank 410 and the second inner bank 420. At least a portion of each of the first electrode 210 and the second electrode 220 may be directly on the first planarization layer 109.

Each of the electrodes 210 and 220 may include a transparent conductive material. For example, each of the electrodes 210 and 220 may include a material such as indium-tin oxide (ITO), indium-zinc oxide (IZO), and/or indium-tin-zinc oxide (ITZO). In some embodiments, each of the electrodes 210 and 220 may include a conductive material having high reflectivity. For example, each of the electrodes 210 and 220 may include a metal such as silver (Ag), copper (Cu), and/or aluminum (Al) as a material having high reflectivity. In this case, each of the electrodes 210 and 220 may reflect light, which travels toward the side surfaces of the first inner bank 410 and the second inner bank 420 after being emitted from the light emitting elements 300, above (e.g., away from) each subpixel PXn.

However, embodiments are not limited to this case, and each of the electrodes 210 and 220 may also each independently have a structure in which a transparent conductive material layer and a metal layer having high reflectivity are stacked, or a structure of a single layer including the transparent conductive material and the metal. In an example embodiment, the electrodes 210 and 220 may each independently have a stacked structure of ITO/Ag/ITO, ITO/Ag/IZO, or ITO/Ag/ITZO/IZO, or may be (e.g., may be formed of) an alloy containing aluminum (Al), nickel (Ni), lanthanum (La), and/or the like.

The first insulating layer 510 may be on the first planarization layer 109, the first electrode 210, and the second electrode 220. The first insulating layer 510 may be not only in an area between the electrodes 210 and 220 and/or between the inner banks 410 and 420, but also on an opposite side of each of the inner banks 410 and 420 from the area between the inner banks 410 and 420 (e.g., the planarization layer 109 may be positioned under each of the inner banks 410 and 420). In some embodiments, the first insulating layer 510 partially covers the first electrode 210 and the second electrode 220. For example, the first insulating layer 510 may be on the entire surface of the first planarization layer 109, including in an area where the first electrode 210 and the second electrode 220 are arranged, but may expose a portion of an upper surface of each of the first electrode 210 and the second electrode 220. The first insulating layer 510 may have openings partially exposing the first electrode 210 and the second electrode 220 and may cover only sides (e.g., a side and the other side) of each of the first electrode 210 and the second electrode 220. The first electrode 210 and the second electrode 220 on the inner banks 410 and 420 may be partially exposed by the openings in the first insulating layer 510.

The first insulating layer 510 may protect the first electrode 210 and the second electrode 220 while insulating them from each other. In addition, the first insulating layer 510 may prevent or reduce the risk of the light emitting elements 300 on the first insulating layer 510 from directly contacting other members and thus being damaged. However, the shape and structure of the first insulating layer 510 are not limited to the above example.

In an example embodiment, a step may be formed in a portion of an upper surface of the first insulating layer 510 between the first electrode 210 and the second electrode 220. In some embodiments, the first insulating layer 510 may include an inorganic insulating material. A portion of the upper surface of the first insulating layer 510 partially covering the first electrode 210 and the second electrode 220 may be stepped due to a step (e.g., a difference in height) formed by the electrodes 210 and 220 under the first insulating layer 510. Accordingly, an empty space may be formed between the upper surface of the first insulating layer 510 and the light emitting elements 300 (e.g., lower surfaces of the light emitting elements 300) on the first insulating layer 510 between the first electrode 210 and the second electrode 220. The empty space may be filled with a material that forms the second insulating layer 520 to be described in more detail herein below.

The outer bank 450 may be on the first insulating layer 510. As illustrated in FIGS. 2 and 3, the outer bank 450 may be provided at the boundary between the subpixels PXn. The outer bank 450 may extend at least in the second direction DR2, and may partially surround the inner banks 410 and 420 and the electrodes 210 and 220, as well as the area where the light emitting elements 300 are arranged between the inner banks 410 and 420 and between the electrodes 210 and 220. In addition, the outer bank 450 may further include a portion extending in the first direction DR1, thereby forming a grid pattern on the entire surface of the display area DPA.

According to an embodiment, a height HC (e.g., in the second direction DR2) of the outer bank 450 may be greater than a height HA (e.g., in the second direction DR2) of each of the inner banks 410 and 420. Unlike the inner banks 410 and 420, the outer bank 450 may separate neighboring subpixels PXn while preventing (or reducing) an ink from overflowing to adjacent subpixels PXn during an inkjet process for placing the light emitting elements 300 that takes place during the manufacturing process of the display device 10. For example, the outer bank 450 may separate inks in which different light emitting elements 300 are dispersed for different subpixels PXn, so as to prevent (or reduce) the inks from being mixed with each other. Like the inner banks 410 and 420, the outer bank 450 may include, but is not limited to, polyimide (PI).

The light emitting elements 300 may be between the first electrode 210 and the second electrode 220, and/or in the opening area HP formed between the first inner bank 410 and the second inner bank 420. Each of the light emitting elements 300 may have an end electrically coupled to the first electrode 210 and another end electrically coupled to the second electrode 220. Each of the light emitting elements 300 may be electrically coupled to the first electrode 210 and the second electrode 220 through the contact electrodes 260.

The light emitting elements 300 may be spaced apart from each other and aligned to be substantially parallel to each other. A gap between the light emitting elements 300 is not particularly limited. In some cases, a plurality of light emitting elements 300 may be positioned adjacent to each other to form a cluster, and a plurality of other light emitting elements 300 may be positioned at regular intervals to form a cluster. In some embodiments, the light emitting elements 300 may have a non-uniform density but may be oriented and aligned in one direction. In an example embodiment, the light emitting elements 300 may extend in one direction, and the direction in which each of the electrodes 210 and 220 extends may be substantially perpendicular to the direction in which the light emitting elements 300 extend. In some embodiments, the extension direction of the light emitting elements 300 may not be perpendicular to the extension direction of the electrodes 210 and 220, but may be oblique to the direction in which each of the electrodes 210 and 220 extends.

The light emitting elements 300 according to an embodiment may include active layers 330 including different materials to emit light of different wavelength bands. The display device 10 according to an embodiment may include the light emitting elements 300 which emit light of different wavelength bands. Each light emitting element 300 of the first subpixel PX1 may include an active layer 330 that emits light of the first color, whose central wavelength band is a first wavelength, each light emitting element 300 of the second subpixel PX2 may include an active layer 330 that emits light of the second color, whose central wavelength band is a second wavelength, and each light emitting element 300 of the third subpixel PX3 may include an active layer 330 that emits light of the third color, whose central wavelength band is a third wavelength.

Accordingly, the light of the first color may be output from the first subpixel PX1, the light of the second color may be output from the second subpixel PX2, and the light of the third color may be output from the third subpixel PX3. In some embodiments, the light of the first color may be blue light having a central wavelength band in the range of 450 nm to 495 nm, the light of the second color may be green light having a central wavelength band in the range of 495 nm to 570 nm, and the light of the third color may be red light having a central wavelength band in the range of 620 nm to 752 nm. In some embodiments, the first subpixel PX1, the second subpixel PX2, and the third subpixel PX3 may include the light emitting elements 300 of the same type (or kind) to emit light of substantially the same color.

The light emitting elements 300 may be on the first insulating layer 510 in the opening area HP between the inner banks 410 and 420 and/or between the electrodes 210 and 220. For example, the light emitting elements 300 may be on the first insulating layer 510 between the inner banks 410 and 420. One or more portions of each light emitting element 300 may overlap the electrodes 210 and 220 in the thickness direction. For example, an end portion of each of the light emitting elements 300 may overlap the first electrode 210 in the thickness direction to lie on the first electrode 210, and the other end portion of each of the light emitting elements 300 may overlap the second electrode 220 to lie on the second electrode 220. However, embodiments are not limited to this case. In some embodiments, at least some of the light emitting elements 300 in each subpixel PXn may be in an area other than the area between the inner banks 410 and 420, for example, may be between each of the inner banks 410 and 420 and the outer bank 450.

Each of the light emitting elements 300 may include a plurality of layers arranged in a direction parallel to an upper surface of the first substrate 101 and/or the first planarization layer 109. Each of the light emitting elements 300 of the display device 10 according to an embodiment may extend in a direction and may have a structure in which a plurality of semiconductor layers are sequentially arranged along the direction in which the light emitting elements 300 extend. The direction in which the light emitting elements 300 extend may be parallel to the first planarization layer 109, and the semiconductor layers included in each of the light emitting elements 300 may be sequentially arranged along the direction parallel to the upper surface of the first planarization layer 109. However, embodiments are not limited to this case. In some embodiments, when each of the light emitting elements 300 has a different structure, the layers may be arranged in a direction perpendicular (e.g., substantially perpendicular) to the first planarization layer 109. The structure of each of the light emitting elements 300 will be described in more detail herein below with reference to other drawings included herein.

As described above, the side surfaces PS1 and PS2 of the inner banks 410 and 420 may be curved, and light emitted from the light emitting elements 300 may be reflected by the electrodes 210 and 220 positioned on the side surfaces PS1 and PS2 of the inner banks 410 and 420, to travel above (e.g., away from) the first substrate 101. The structure of each of the inner banks 410 and 420 and the propagation of light emitted from the light emitting elements 300 according to the structure will now be described in more detail with further reference to other drawings included herein.

Figure 4:
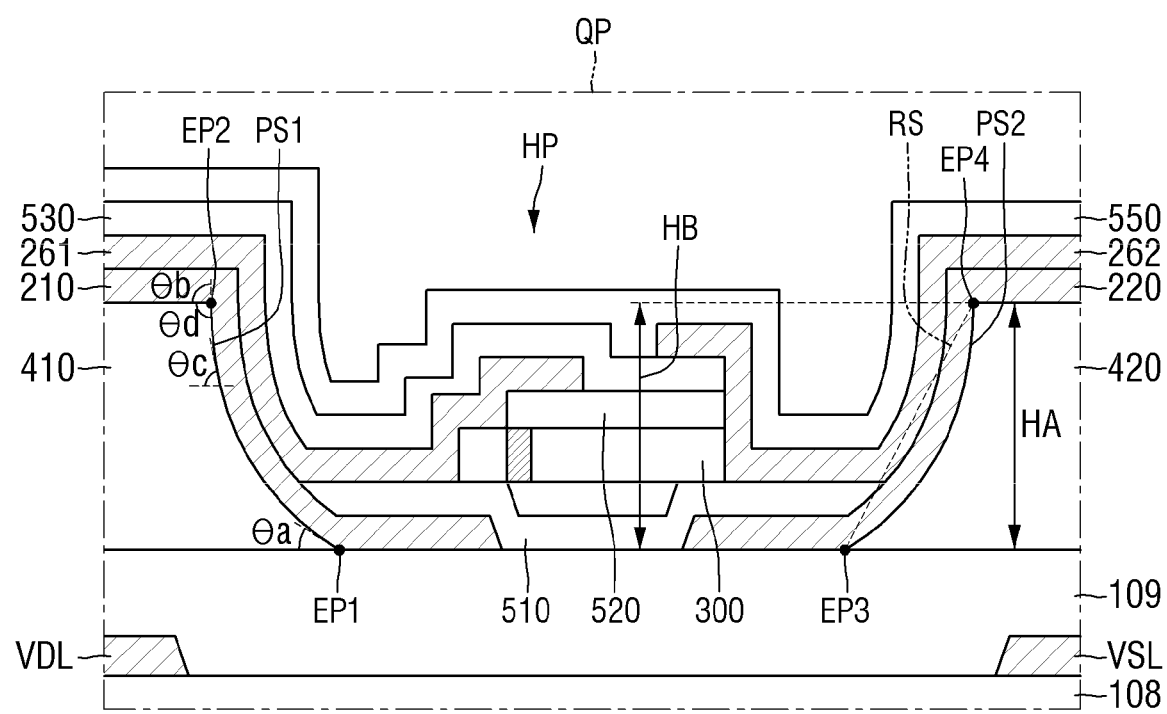
FIG. 4 is an enlarged view of a portion QP of FIG. 3.

FIG. 4 is an enlarged view of a portion QP of FIG. 3.

FIG. 4 is an enlarged view of the opening area HP formed between the first inner bank 410 and the second inner bank 420, and a light emitting element 300 is positioned in the opening area HP.

Referring to FIG. 4, in the display device 10 according to an embodiment, at least the facing (e.g., facing each other) side surfaces PS1 and PS2 of the first inner bank 410 and the second inner bank 420 may be curved. The first inner bank 410 may include the first side surface PS1 facing the second inner bank 420, and the second inner bank 420 may include the second side surface PS2 facing the first side surface PS1. The inner banks 410 and 420 may be arranged such that the first side surface PS1 and the second side surface PS2 face each other, and the opening area HP may be defined between the first side surface PS1 and the second side surface PS2. For example, the opening area HP may be understood as an area surrounded by the facing side surfaces PS1 and PS2 of the inner banks 410 and 420.

The respective side surfaces PS1 and PS2 of the inner banks 410 and 420 of the display device 10 according to an embodiment may be recessed toward centers of the inner banks 410 and 420 to have a curved shape. The opening area HP formed by the respective side surfaces PS1 and PS2 of the inner banks 410 and 420 surrounding the opening area HP may be concave with respect to the upper surface of the first substrate 101 and/or the first planarization layer 109.

For example, the slope of each of the respective side surfaces PS1 and PS2 of the inner banks 410 and 420 of the display device 10 according to an embodiment may vary depending on position at which the slope is being measured. For example, the first side surface PS1 of the first inner bank 410 may include a first end portion EP1, which contacts a lower surface of the first inner bank 410, and a second end portion EP2, which contacts an upper surface of the first inner bank 410. The first side surface PS1 may have a slope measured at each end portion EP1 or EP2 in a tangential direction of the first side surface PS1. In an example embodiment, the slope of the first side surface PS1 of the first inner bank 410 measured at the first end portion EP1 may be different from the slope measured at the second end portion EP2, and the magnitude of the slope of the first side surface PS1 may increase from the first end portion EP1 toward the second end portion EP2.

A first inclination angle θa may be an inclination angle between a line tangent to the first end portion EP1 of the first side surface PS1 and the lower surface of the first inner bank 410, and a second inclination angle θb may be an inclination angle between a line tangent to the second end portion EP2 and the upper surface of the first inner bank 410. As illustrated in FIG. 4, the first inclination angle θa measured at the first end portion EP1 may be smaller than the second inclination angle θb measured at the second end portion EP2. In addition, the first inclination angle θa measured at the first end portion EP1 may be smaller than a third inclination angle θc measured at a portion located between the first end portion EP1 and the second end portion EP2, and the third inclination angle θc measured at the portion located between the first end portion EP1 and the second end portion EP2 may be smaller than the second inclination angle θb measured at the second end portion EP2. For example, the third inclination angle θc may be an inclination angle between a line tangent to the portion located between the first end portion EP1 and the second end portion EP2 and a line parallel to the lower and upper surfaces of the first inner bank 410.

During the manufacturing process of the display device 10, the first inner bank 410 and the second inner bank 420 may be formed by isotropic etching using dry etching. Accordingly, according to an embodiment, the side surfaces PS1 and PS2 may respectively be recessed toward the centers of the inner banks 410 and 420 to have a curved (e.g., concave) shape. The slope of each of the curved side surfaces PS1 and PS2 measured in the tangential direction may vary depending on position at which the slope is being measured. For example, the slope of each side surface PS1 or PS2 measured at an end portion contacting the lower surface of the inner bank 410 or 420, respectively, may be smaller than the slope measured at an end portion contacting the upper surface. Accordingly, the opening area HP formed by (e.g., between) the side surfaces PS1 and PS2 surrounding the opening area HP may have a shape surrounding the light emitting element 300, and most of the light emitted from the light emitting element 300 may travel toward the side surfaces PS1 and PS2.

In addition, in an embodiment, in the first inner bank 410, the sum of the first inclination angle θa measured at the first end portion EP1 of the first side surface PS1 and a fourth inclination angle θd measured at the second end portion EP2 between the upper surface of the first inner bank 410 and the first side surface PS1 may be less than 180 degrees. The second inclination angle θb and the fourth inclination angle θd may be angles facing each other at the second end portion EP2 with respect to the upper surface of the first inner bank 410, and the sum of the second inclination angle θb and the fourth inclination angle θd may be 180 degrees. As described above, because the first inclination angle θa measured at the first end portion EP1 of the first side surface PS1 has a smaller value than the second inclination angle θb, the sum of the first inclination angle θa and the fourth inclination angle θd may be smaller (e.g., less) than 180 degrees. The above description may apply equally to the second side surface PS2 of the second inner bank 420.

The side surfaces PS1 and PS2 of the inner banks 410 and 420 may be concave with their slope increasing from the lower surfaces of the inner banks 410 and 420 toward the upper surfaces. According to an embodiment, each of the side surfaces PS1 and PS2 of the inner banks 410 and 420 may be located below a reference line RS (see FIG. 4) connecting both side parts (or end portions of each of the side surfaces PS1 and PS2).

For example, the second side surface PS2 of the second inner bank 420 may include a third end portion EP3 contacting the lower surface of the second inner bank 420 and a fourth end portion EP4 contacting the upper surface of the second inner bank 420. In addition, the reference line RS extending (e.g., extending in a direction) to connect (e.g., couple) the third end portion EP3 and the fourth end portion EP4 may be further defined. According to an embodiment, each of the side surfaces PS1 and PS2 of the inner banks 410 and 420 may be located below the reference line RS connecting both end portions of the respective side surface. As described above, the side surfaces PS1 and PS2 may each increase in slope from the lower surfaces of the respective inner banks 410 and 420 toward the upper surfaces, and may be recessed toward the centers of the respective inner banks 410 and 420. For example, the second side surface PS2 of the second inner bank 420 having the above-described shape may be located below the reference line RS extending in a direction to connect (e.g., couple) the third end portion EP3 and the fourth end portion EP4.

Because the display device 10 according to an embodiment includes the inner banks 410 and 420 having the shape according to the present embodiments, the luminous efficiency of each pixel PX and/or subpixel PXn can be improved.

Figure 5:
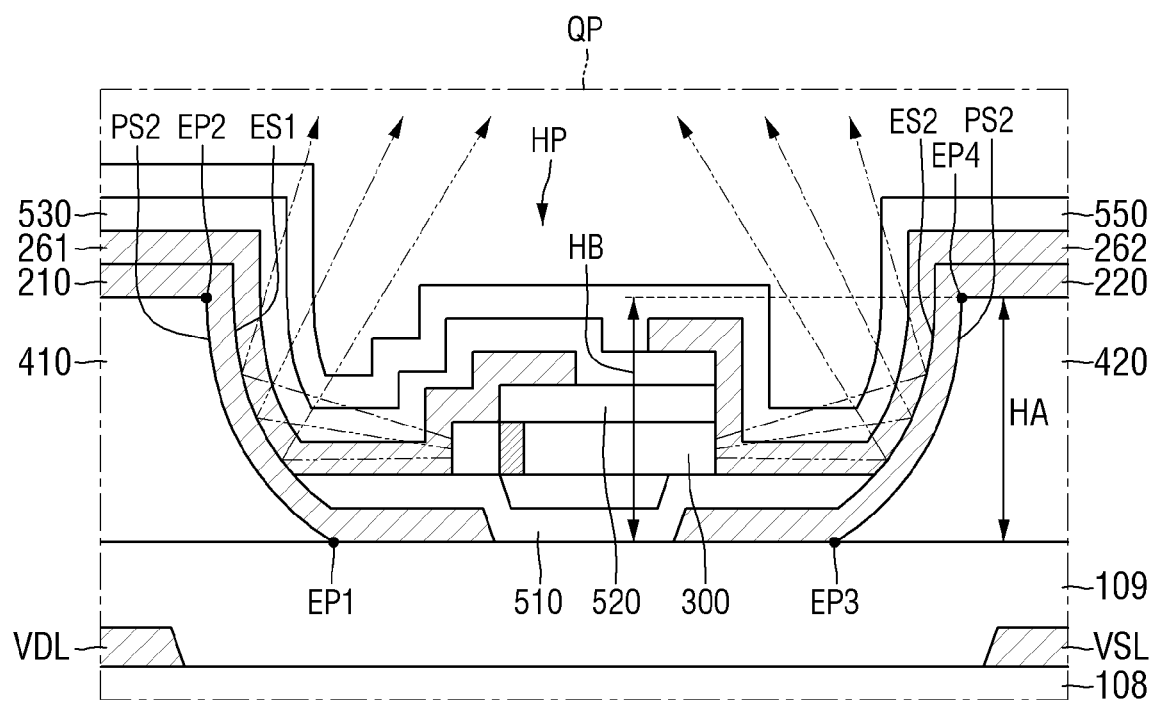
FIG. 5 is a schematic view illustrating the propagation of light emitted from a light emitting element of a display device according to an embodiment.

FIG. 5 is a schematic view illustrating the propagation of light emitted from a light emitting element 300 of the display device 10 according to an embodiment.

Referring to FIG. 5, light emitted from the light emitting element 300 may travel toward the respective side surfaces PS1 and PS2 of the inner banks 410 and 420 and may be reflected off upper surfaces ES1 and ES2 of the electrodes 210 and 220 arranged on the side surfaces PS1 and PS2. Light emitted from the light emitting element 300 and then reflected by the electrodes 210 and 220 may travel above (e.g., away from) the first substrate 101 and/or the first planarization layer 109.

Here, because the side surfaces PS1 and PS2 of the inner banks 410 and 420 are curved, the opening area HP formed by the side surfaces PS1 and PS2 surrounding the opening area HP may have a shape surrounding the light emitting element 300. The opening area HP may be concave with respect to the upper surface of the first substrate 101 and/or the upper surface of the first planarization layer 109. Light generated by the light emitting element 300 may be radiated through both exposed end surfaces of the light emitting element 300, and most of the light emitted from the light emitting element 300 may travel toward the curved side surfaces PS1 and PS2 of the inner banks 410 and 420. According to an embodiment, of the light emitted from the light emitting element 300, the amount of light travelling toward each side surface PS1 or PS2 may increase, and the amount of light reflected by each electrode 210 or 220 may increase. For example, of the light emitted from the light emitting element 300, the amount of light travelling above (e.g., away from) the first substrate 101 may increase.

In addition, because the side surfaces PS1 and PS2 of the inner banks 410 and 420 are curved to have a concave shape, light reflected after being emitted from the light emitting element 300 may travel toward a center of the opening area HP. Accordingly, light emitted from the light emitting element 300 and then reflected by the electrodes 210 and 220 may be concentrated in a set or specific direction. In the display device 10 according to an embodiment, the curved side surfaces PS1 and PS2 of the inner banks 410 and 420 may increase the amount of light directed above (e.g., away from) the first substrate 101 after being emitted from the light emitting element 300, while also concentrating the emitted light in a set or specific direction, and may improve the luminous efficiency of each subpixel PX.

Each of the inner banks 410 and 420 may have the height HA measured from the lower surface to the upper surface thereof, and the opening area HP between the inner banks 410 and 420 may have a depth HB measured from a lower surface of the opening area HP to the upper surfaces of the inner banks 410 and 420. The depth HB of the opening area HP may be defined as a distance measured from a lower surface of the first insulating layer 510 to the upper surfaces of the inner banks 410 and 420. According to an embodiment, the height HA of each of the inner banks 410 and 420 may be equal to the depth HB of the opening area HP.

In some embodiments, the inner banks 410 and 420 may each independently include the same material as the first planarization layer 109 and the second interlayer insulating layer 108 under the inner banks 410 and 420, and the first planarization layer 109 and the second interlayer insulating layer 108 may also be etched in an etching process for forming the inner banks 410 and 420 during the manufacturing process of the display device 10. In some embodiments, the height HA of each of the inner banks 410 and 420 and the depth HB of the opening area HP may be different from each other. In this case, the light emitting element 300 arranged in the opening area HP may be on the same layer as the second data conductive layer or the first data conductive layer under the first planarization layer 109.

Referring again to FIG. 3, the second insulating layer 520 may be partially on the light emitting elements 300 arranged between the first electrode 210 and the second electrode 220. For example, the second insulating layer 520 may partially cover an outer surface of each of the light emitting elements 300 to protect the light emitting element 300, while fixing (e.g., securing) the light emitting element 300 during the manufacturing process of the display device 10. A portion of the second insulating layer 520 which is on each of the light emitting elements 300 may extend in the second direction DR2 between the first electrode 210 and the second electrode 220 in plan view. For example, the second insulating layer 520 may form a stripe or island pattern in each subpixel PXn.

The second insulating layer 520 may be on the light emitting elements 300 and may expose both end portions of each of the light emitting elements 300. The exposed ends (e.g., end portions) of each of the light emitting elements 300 may contact the contact electrodes 260 to be described in more detail herein below. This shape of the second insulating layer 520 may be formed by patterning the material that forms the second insulting layer 520 using a suitable mask process. A mask used to form the second insulating layer 520 may have a width (e.g., an opening or aperture) smaller than a length of each of the light emitting elements 300 such that the material that forms the second insulating layer 520 may be patterned to expose both ends of each of the light emitting elements 300. However, embodiments are not limited to this case.

In an example embodiment, a portion of the material that forms the second insulating layer 520 may be between a lower surface of each light emitting element 300 and the first insulating layer 510. For example, the second insulating layer 520 may fill a space between the first insulating layer 510 and each light emitting element 300 formed during the manufacturing process of the display device 10. Accordingly, the second insulating layer 520 may be formed to cover the outer surface of each light emitting element 300.

The contact electrodes 260 and the third insulating layer 530 may be on the second insulating layer 520.

As illustrated in FIG. 2, the contact electrodes 260 may extend in a direction (e.g., the second direction DR2). The contact electrodes 260 may contact the light emitting elements 300 and the electrodes 210 and 220, and each of the light emitting elements 300 may receive electrical signals from the first electrode 210 and the second electrode 220 through the contact electrodes 260.

The contact electrodes 260 may include the first contact electrode 261 and the second contact electrode 262. The first contact electrode 261 and the second contact electrode 262 may be on the first electrode 210 and the second electrode 220, respectively. The first contact electrode 261 may be on the first electrode 210, the second contact electrode 262 may be on the second electrode 220, and the first contact electrode 261 and the second contact electrode 262 may extend in the second direction DR2. The first contact electrode 261 and the second contact electrode 262 may be spaced apart to face each other in the first direction DR1 and may form stripe patterns in the emission area EMA of each subpixel PXn.

In some embodiments, a width of each of the first contact electrode 261 and the second contact electrode 262 measured in a direction (e.g., in the first direction DR1) may be equal to or greater than the width of each of the first electrode 210 and the second electrode 220 measured in the direction. The first contact electrode 261 and the second contact electrode 262 may respectively contact one end portion and the other end portion of each light emitting element 300, and may cover both side surfaces of the first electrode 210 and the second electrode 220. As described above, the upper surfaces of the first electrode 210 and the second electrode 220 may be partially exposed (e.g., by the first insulating layer 510), and the first contact electrode 261 and the second contact electrode 262 may contact the exposed upper surfaces of the first electrode 210 and the second electrode 220, respectively. For example, the first contact electrode 261 may contact a portion of the first electrode 210 which is located on the first inner bank 410, and the second contact electrode 262 may contact a portion of the second electrode 220 which is located on the second inner bank 420. In some embodiments, the first contact electrode 261 and the second contact electrode 262 may have smaller widths than the first electrode 210 and the second electrode 220, respectively, and may cover only the exposed parts of the upper surfaces of the first electrode 210 and the second electrode 220. In some embodiments, as illustrated in FIG. 3, at least a portion of each of the first contact electrode 261 and the second contact electrode 262 may be on the first insulating layer 510.

According to an embodiment, a semiconductor layer may be exposed at both end surfaces of each light emitting element 300 in the direction in which each light emitting element 300 extends (e.g., the direction DR1), and the first contact electrode 261 and the second contact electrode 262 may contact each light emitting element 300 at the end surfaces where the semiconductor layer is exposed. In some embodiments, side surfaces of both ends of each light emitting element 300 may be partially exposed. During the manufacturing process of the display device 10, an insulating film 380 (see FIG. 7) surrounding an outer surface of the semiconductor layer of each light emitting element 300 may be partially removed in a process of forming the second insulating layer 520 that covers the outer surface of each light emitting element 300, and the exposed side surfaces of each light emitting element 300 may contact the first contact electrode 261 and the second contact electrode 262, respectively. An end portion of each of the light emitting elements 300 may be electrically coupled to the first electrode 210 through the first contact electrode 261, and the other end portion of each of the light emitting elements 300 may be electrically coupled to the second electrode 220 through the second contact electrode 262.

Although one first contact electrode 261 and one second contact electrode 262 are illustrated in one subpixel PXn in the drawings, embodiments are not limited to this case. The number of the first contact electrodes 261 and the second contact electrodes 262 may vary according to the number of the first electrodes 210 and the second electrodes 220 in each subpixel PXn.

As illustrated in FIG. 3, the first contact electrode 261 may be on the first electrode 210 and the second insulating layer 520. The first contact electrode 261 may contact an end portion of each of the light emitting elements 300 and the exposed upper surface of the first electrode 210. The end portion of each of the light emitting elements 300 may be electrically coupled to the first electrode 210 through the first contact electrode 261.

The third insulating layer 530 is on the first contact electrode 261. The third insulating layer 530 may electrically insulate the first contact electrode 261 and the second contact electrode 262 from each other. The third insulating layer 530 may cover the first contact electrode 261 but may not be on the other end portion of each light emitting element 300 so that the light emitting element 300 can contact the second contact electrode 262 through the other end portion. The third insulating layer 530 may partially contact the first contact electrode 261 and the second insulating layer 520 on an upper surface of the second insulating layer 520. A side surface of the third insulating layer 530 in a direction in which the second electrode 220 is arranged (e.g., in a direction facing toward the second electrode 220) may be aligned with a side surface of the second insulating layer 520. In addition, the third insulating layer 530 may be in the non-emission area, for example, on the first insulating layer 510 that is arranged on the first planarization layer 109. However, embodiments are not limited to this case.

The second contact electrode 262 is on the second electrode 220, the second insulating layer 520, and the third insulating layer 530. The second contact electrode 262 may contact the other end portion of each light emitting element 300 and the exposed upper surface of the second electrode 220. The other end portion of each light emitting element 300 may be electrically coupled to the second electrode 220 through the second contact electrode 262.

For example, the first contact electrode 261 may be between the first electrode 210 and the third insulating layer 530, and the second contact electrode 262 may be on the third insulating layer 530. The second contact electrode 262 may partially contact the second insulating layer 520, the third insulating layer 530, the second electrode 220, and the light emitting elements 300. An end portion of the second contact electrode 262 in a direction in which the first electrode 210 is arranged (e.g., in a direction facing toward the first electrode 210) may be on the third insulating layer 530. The first contact electrode 261 and the second contact electrode 262 may not contact each other due to the second insulating layer 520 and the third insulating layer 530. However, embodiments are not limited to this case. In some embodiments, the third insulating layer 530 may be omitted.

Figure 6:
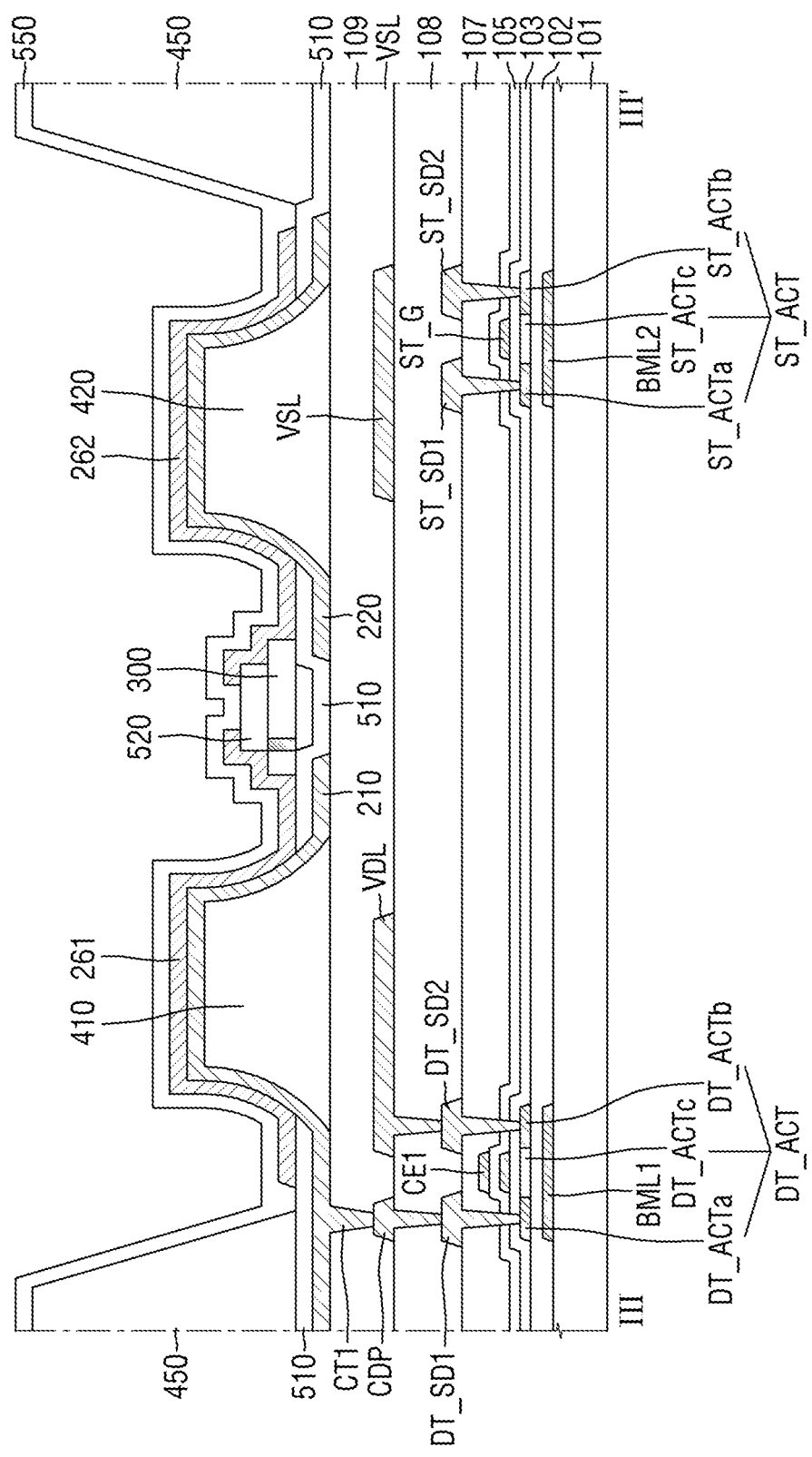
FIG. 6 is a cross-sectional view of a display device according to an embodiment.

FIG. 6 is a partial cross-sectional view of a display device 10 according to an embodiment.

Referring to FIG. 6, in the display device 10 according to an embodiment, a third insulating layer 530 may be omitted, and a portion of a second contact electrode 262 may be directly on a second insulating layer 520. A first contact electrode 261 and the second contact electrode 262 may be spaced apart from each other on the second insulating layer 520. The second insulating layer 520 may include an organic insulating material, and the first contact electrode 261 and the second contact electrode 262 may be formed together in the same process. Here, a width (in the first direction DR1)

of the second insulating layer 520 may be smaller than a length of a light emitting element 300, and both side surfaces of the second insulating layer 520 may be spaced apart from both end surfaces of the light emitting element 300. For example, the second insulating layer 520 may expose the side surfaces and the upper surface of both end portions of the light emitting element 300.

Facing (e.g., facing each other) side surfaces of the first contact electrode 261 and the second contact electrode 262 may be on the second insulating layer 520 to be spaced apart from each other (in the first direction DR1). The first contact electrode 261 may contact an end portion of the light emitting element 300, a first electrode 210, and the second insulating layer 520, and the second contact electrode 262 may contact the other end portion of the light emitting element 300, a second electrode 220, and the second insulating layer 520. Other elements are the same as described above, and thus redundant descriptions thereof will not be provided.

The contact electrodes 260 may include a conductive material such as ITO, IZO, ITZO, and/or aluminum (Al). For example, the contact electrodes 260 may include a transparent conductive material, and light emitted from each light emitting element 300 may pass through the contact electrodes 260 and travel toward the electrodes 210 and 220. As illustrated in FIG. 5, each electrode 210 or 220 may include a material having high reflectivity, and the electrodes 210 and 220 on the inclined side surfaces of the inner banks 410 and 420 may reflect incident light above (e.g., away from) the first substrate 101. However, embodiments are not limited to this case.

The fourth insulating layer 550 may be on the entire surface of the first substrate 101. The fourth insulating layer 550 may function to protect members on the first substrate 101 from the external environment.

The first insulating layer 510, the second insulating layer 520, the third insulating layer 530, and the fourth insulating layer 550 described above may each independently include an inorganic insulating material or an organic insulating material. In an example embodiment, each of the first insulating layer 510, the second insulating layer 520, the third insulating layer 530, and the fourth insulating layer 550 may include an inorganic insulating material such as silicon oxide (SiOx), silicon nitride (SiNx), silicon oxynitride (SiOxNy), aluminum oxide ($Al_2O_3$), and/or aluminum nitride (AlN). In some embodiments, each of the first insulating layer 510, the second insulating layer 520, the third insulating layer 530, and the fourth insulating layer 550 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, and/or polymethyl methacrylate-polycarbonate synthetic resin.

The light emitting elements 300 may be LEDs. For example, each of the light emitting elements 300 may be an inorganic LED having a size of micrometers or nanometers and made of an inorganic material. When an electric field is formed in a set or specific direction between two electrodes facing each other, the inorganic LED may be aligned between the two electrodes where polarity is formed. The light emitting element 300 may be aligned between the two electrodes by the electric field formed on the electrodes.

The light emitting elements 300 according to an embodiment may extend in one direction. Each of the light emitting elements 300 may be shaped like a rod, a wire, a tube, and/or the like. In an example embodiment, each of the light emitting elements 300 may be shaped like a cylinder or a rod. In some embodiments, each of the light emitting elements 300 may have any suitable shape including polygonal prism shape such as a cube, a rectangular parallelepiped shape, and/or a hexagonal prism shape, and may extends in a direction and have a partially inclined outer surface. A plurality of semiconductors included in each of the light emitting elements 300, which will be described in more detail herein below, may be sequentially arranged or stacked along the extension direction of the light emitting element 300.

Each of the light emitting elements 300 may include a semiconductor layer doped with impurities of any suitable conductivity type (e.g., a p type or an n type). The semiconductor layer may receive an electrical signal from an external power source and emit the electrical signal as light of a set or specific wavelength band.

Figure 7:
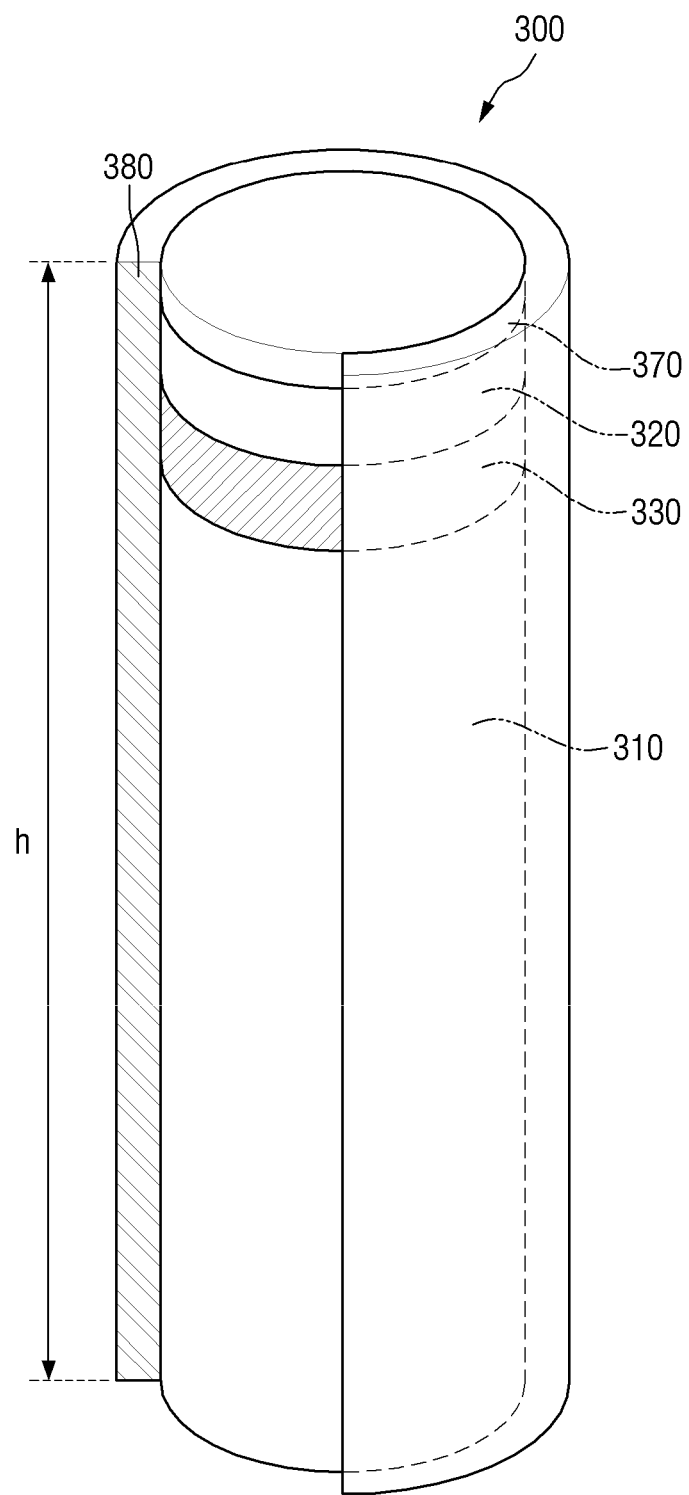
FIG. 7 is a schematic view of a light emitting element according to an embodiment.

FIG. 7 is a schematic view of a light emitting element 300 according to an embodiment.

Referring to FIG. 7, the light emitting element 300 may include a first semiconductor 310, a second semiconductor 320, an active layer 330, an electrode layer 370, and an insulating film 380.

The first semiconductor layer 310 may be an n-type semiconductor. In an example, if the light emitting element 300 emits light in a blue wavelength band, the first semiconductor layer 310 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 310 may be any one or more of n-type doped AlGaInN, GaN, AlGaN, InGaN, AlN, and InN. The first semiconductor layer 310 may be doped with an n-type dopant, and the n-type dopant may be, for example, Si, Ge, and/or Sn. In an example embodiment, the first semiconductor layer 310 may be n-GaN doped with n-type Si. A length of the first semiconductor layer 310 may be in the range of, but not limited to, 1.5 μm to 5 μm.

The second semiconductor layer 320 may be on the active layer 330. The second semiconductor layer 320 may be a p-type semiconductor. In an example, if the light emitting element 300 emits light in a blue or green wavelength band, the second semiconductor layer 320 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 320 may be any one or more of p-type doped AlGaInN, GaN, AlGaN, InGaN, AlN, and InN. The second semiconductor layer 320 may be doped with a p-type dopant, and the p-type dopant may be, for example, Mg, Zn, Ca, Se, and/or Ba. In an example embodiment, the second semiconductor layer 320 may be p-GaN doped with p-type Mg. A length of the second semiconductor layer 320 may be in the range of, but not limited to, 0.05 μm to 0.10 μm.

Although each of the first semiconductor layer 310 and the second semiconductor layer 320 is illustrated as being composed of one layer in FIG. 7, embodiments are not limited to this case. In some embodiments, each of the first semiconductor layer 310 and the second semiconductor layer 320 may include more than one layer, for example, may further include a clad layer (e.g., a cladding layer) and/or a tensile strain barrier reducing (TSBR) layer, depending on the material of the active layer 330.

The active layer 330 may be between the first semiconductor layer 310 and the second semiconductor layer 320. The active layer 330 may include a material having a single or multiple quantum well structure. When the active layer 330 includes a material having a multiple quantum well structure, it may have a structure in which a plurality of quantum layers and a plurality of well layers are alternately stacked. The active layer 330 may emit light through combination of electron-hole pairs according to electrical signals received through the first semiconductor layer 310 and the second semiconductor layer 320. For example, when the active layer 330 emits light in the blue wavelength band, it may include a material such as AlGaN and/or AlGaInN. In some embodiments, when the active layer 330 has a multiple quantum well structure in which a quantum layer and a well layer are alternately stacked, the quantum layer may include a material such as AlGaN and/or AlGaInN, and the well layer may include a material such as GaN and/or AlInN. In an example embodiment, the active layer 330 may include AlGaInN as a quantum layer and AlInN as a well layer, and may emit blue light having a central wavelength band in the range of 450 nm to 495 nm.

In some embodiments, the active layer 330 may have a structure in which a semiconductor material having a large band gap energy and a semiconductor material having a small band gap energy are alternately stacked, or may include different Group 3 to 5 (e.g., Group III to V) semiconductor materials, depending on the wavelength band emitted light to be emitting. Light emitted from the active layer 330 is not limited to light in the blue wavelength band. In some embodiments, the active layer 330 may emit light in a red or green wavelength band. A length of the active layer 330 may be in the range of, but not limited to, 0.05 µm to 0.10 µm.

Light emitted from the active layer 330 may be radiated not only through an outer surface of the light emitting element 300 in a longitudinal direction, but also through both side surfaces. The direction of light emitted from the active layer 330 is not limited to one direction.

The electrode layer 370 may be an ohmic contact electrode. However, the electrode layer 370 is not limited to the ohmic contact electrode and may also be, for example, a Schottky contact electrode, but the present embodiments are not limited thereto. The light emitting element 300 may include at least one electrode layer 370. Although the light emitting element 300 includes one electrode layer 370 in FIG. 7, embodiments are not limited to this case. In some embodiments, the light emitting element 300 may include more than one electrode layers 370, or the electrode layer 370 may be omitted. The following description of the light emitting element 300 may apply equally even when the light emitting element 300 includes a different (e.g., a larger) number of electrode layers 370 or further includes another structure.

When the light emitting element 300 is electrically coupled to the electrodes 210 and 220 and/or the contact electrodes 260, the electrode layer 370 may reduce the resistance between the light emitting element 300 and the electrodes 210 and 220 (and/or the contact electrodes 260). The electrode layer 370 may include a conductive metal. For example, the electrode layer 370 may include at least one of aluminum (Al), titanium (Ti), indium (In), gold (Au), silver (Ag), indium-tin oxide (ITO), indium-zinc oxide (IZO), or indium-tin-zinc oxide (ITZO). In some embodiments, the electrode layer 370 may include an n-type or p-type doped semiconductor material. The electrode layer 370 may include the same material or a plurality of different materials, but embodiments are not limited to this case.

The insulating film 380 may surround outer surfaces of the semiconductor layers and the electrode layers described above. In an example embodiment, the insulating film 380 may surround an outer surface of at least the active layer 330, and may extend in the direction in which the light emitting element 300 extends. The insulating film 380 may protect the members that it surrounds. For example, the insulating film 380 may surround side surfaces of the above-described members, but may expose both ends of the light emitting element 300 in the longitudinal direction (e.g., in the extension direction of the light emitting element 300).

In FIG. 7, the insulating film 380 extends in the longitudinal direction of the light emitting element 300 to cover side surfaces of the light emitting element 300, from side surfaces of the first semiconductor layer 310 to side surfaces of the electrode layer 370. However, embodiments are not limited to this case, and the insulating film 380 may cover outer surfaces of the active layer 330 and of only some semiconductor layers, or may cover only a portion of an outer surface of the electrode layer 370 to partially expose the outer surface of the electrode layer 370. In some embodiments, an upper surface of the insulating film 380 may be rounded in cross section in an area adjacent to at least one end portion of the light emitting element 300.

A thickness of the insulating film 380 may be in the range of, but not limited to, 10 nm to 1.0 µm. The thickness of the insulating film 380 may be about 40 nm.

The insulating film 380 may include an insulating material such as silicon oxide (SiOx), silicon nitride (SiNx), silicon oxynitride (SiOxNy), aluminum nitride (AlN), and/or aluminum oxide ($Al_2O_3$). Accordingly, it can prevent or reduce the risk of an electrical short circuit that may occur when the active layer 330 directly contacts an electrode that transmits an electrical signal to the light emitting element 300. In addition, since the insulating film 380 protects the outer surface of the light emitting element 300 including the active layer 330, a decrease in luminous efficiency can be prevented or reduced.

In some embodiments, an outer surface of the insulating film 380 may be treated. When the display device 10 is manufactured, the light emitting element 300 dispersed in a set or predetermined ink may be sprayed onto electrodes and then aligned. Here, the surface of the insulating film 380 may be hydrophobic or hydrophilic-treated so that the light emitting element 300 is kept separate in the ink, without being agglomerated with other adjacent light emitting elements 300.

A length h of the light emitting element 300 may be in the range of 1 µm to 10 µm, or 2 µm to 6 µm, and may be in the range of 3 µm to 5 µm. In addition, a diameter of the light emitting element 300 may be in the range of 300 nm to 700 nm, and an aspect ratio of the light emitting element 300 may be 1.2 to 100. However, embodiments are not limited to this case, and a plurality of light emitting elements 300 included in the display device 10 may also have different suitable diameters according to a difference in composition of the active layer 330. The diameter of the light emitting element 300 may be about 500 nm.

A process of manufacturing the display device 10 according to an embodiment will now be described with reference to other drawings included herein.

FIGS. 8-14 are cross-sectional views illustrating a process of manufacturing a display device according to an embodiment.

Figure 8:
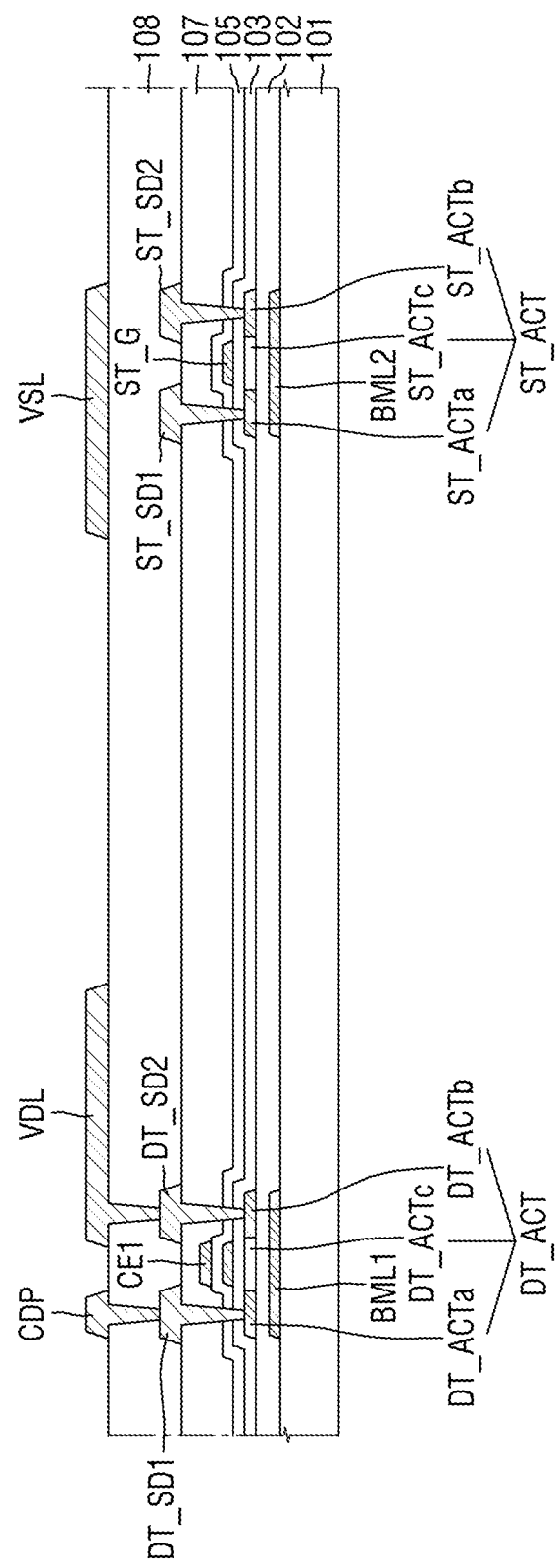
FIGS. 8-14 are cross-sectional views illustrating a process of manufacturing a display device according to an embodiment.

First, referring to FIG. 8, a first substrate 101 is prepared, and a buffer layer 102, a semiconductor layer, a first gate insulating layer 103, a first gate conductive layer, a first protective layer 105, a first interlayer insulating layer 107, a first data conductive layer, a second interlayer insulating layer 108, and a second data conductive layer are formed on the first substrate 101. The semiconductor layer, the conductive layers, and the insulating layers may be formed by any suitable process, and thus a detailed description thereof will not be provided.

Figure 9:
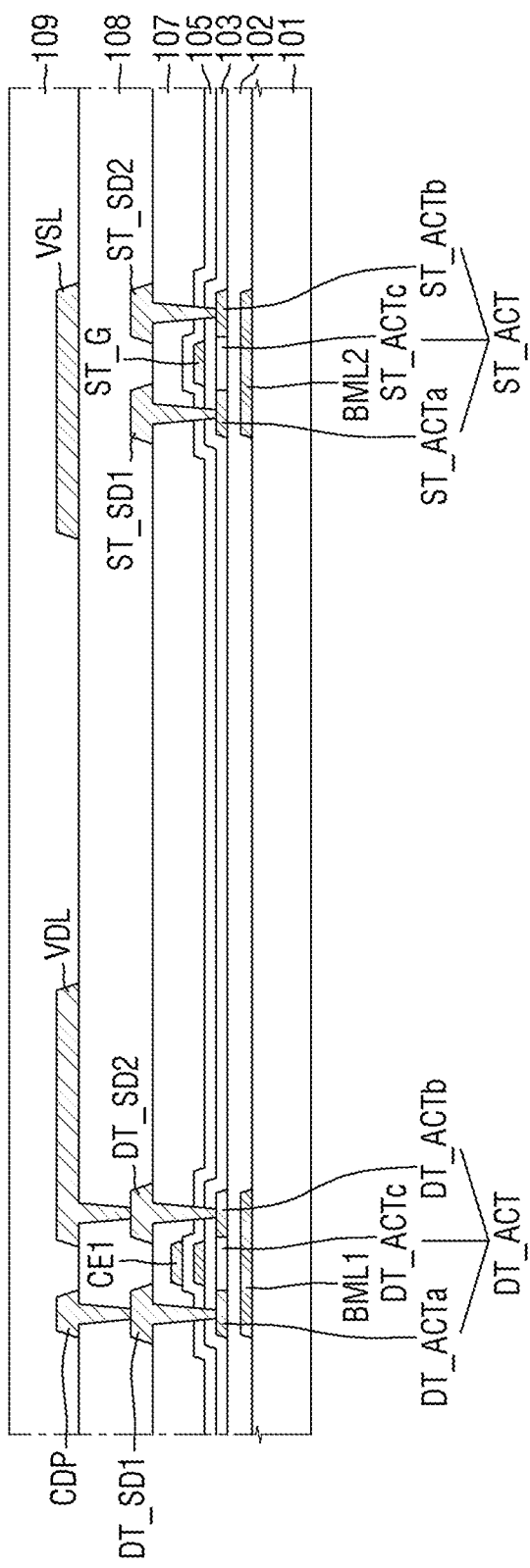

Next, referring to FIG. 9, a first planarization layer 109 is formed on the second data conductive layer to cover the second data conductive layer. In FIG. 9, a first contact hole CT1 and a second contact hole CT2 are not yet formed in the first planarization layer 109. The first planarization layer 109 may be patterned after a first inner bank 410 and a second inner bank 420 are formed in a subsequent process, or may be patterned at the same time as the formation of the first inner bank 410 and the second inner bank 420, and the first contact hole CT1 and the second contact hole CT2 may be formed in the first planarization layer 109.

Figure 10:
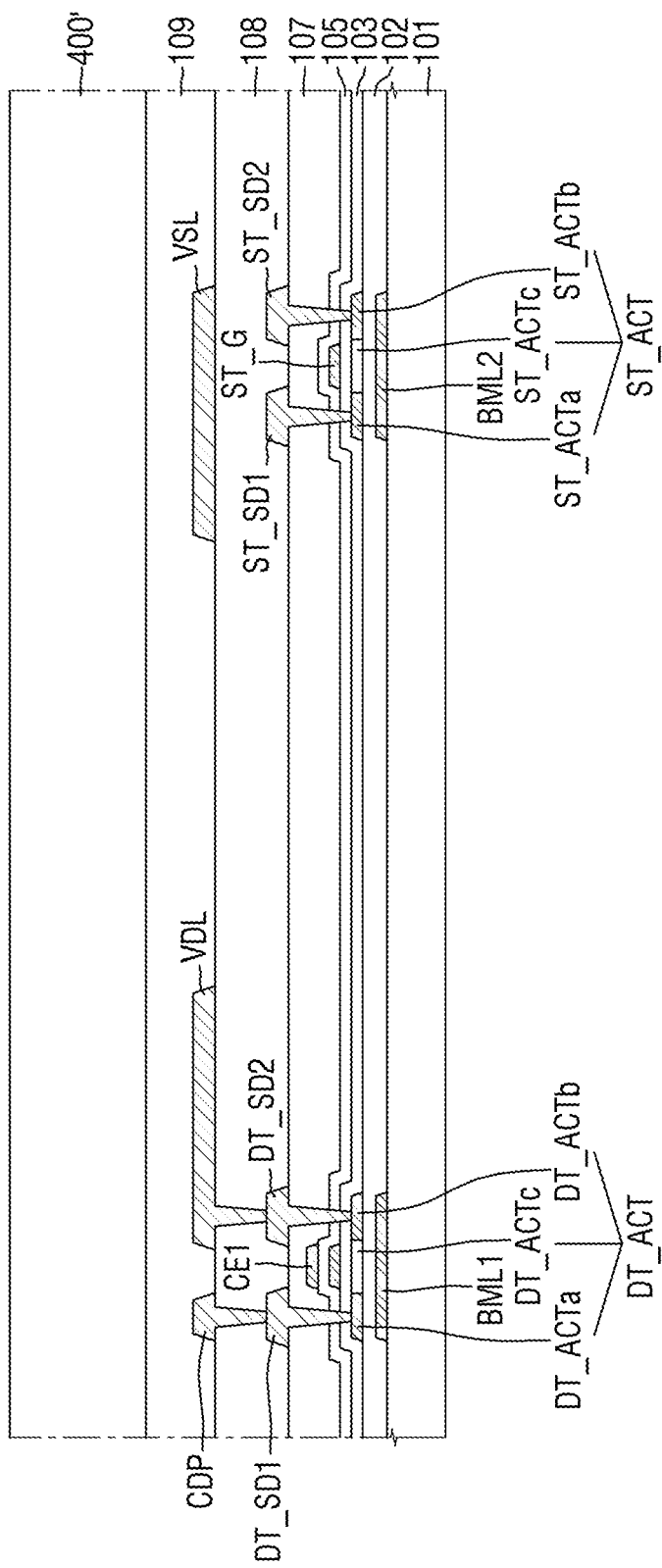

Next, referring to FIG. 10, a bank insulating layer 400' is formed on the first planarization layer 109. The bank insulating layer 400' may be etched or patterned in a subsequent process to form the first inner bank 410 and the second inner bank 420 described above. In FIG. 10, the first planarization layer 109 and the bank insulating layer 400' are illustrated as separate layers. However, the display device 10 according to an embodiment may also not include the first planarization layer 109, and may instead include one bank layer including the first inner bank 410 and the second inner bank 420 on the second data conductive layer. In this case, during the manufacturing process of the display device 10, the first planarization layer 109 may not be formed, and a bank insulating layer 400' thicker than the bank insulating layer 400' of FIG. 10 may be directly formed on the second data conductive layer. Then, the first inner bank 410 and the second inner bank 420 formed by etching the bank insulating layer 400' may be positioned directly on the second data conductive layer or the second interlayer insulating layer 108. This embodiment will be described in more detail herein below with reference to other drawings included herein.

Figure 11:
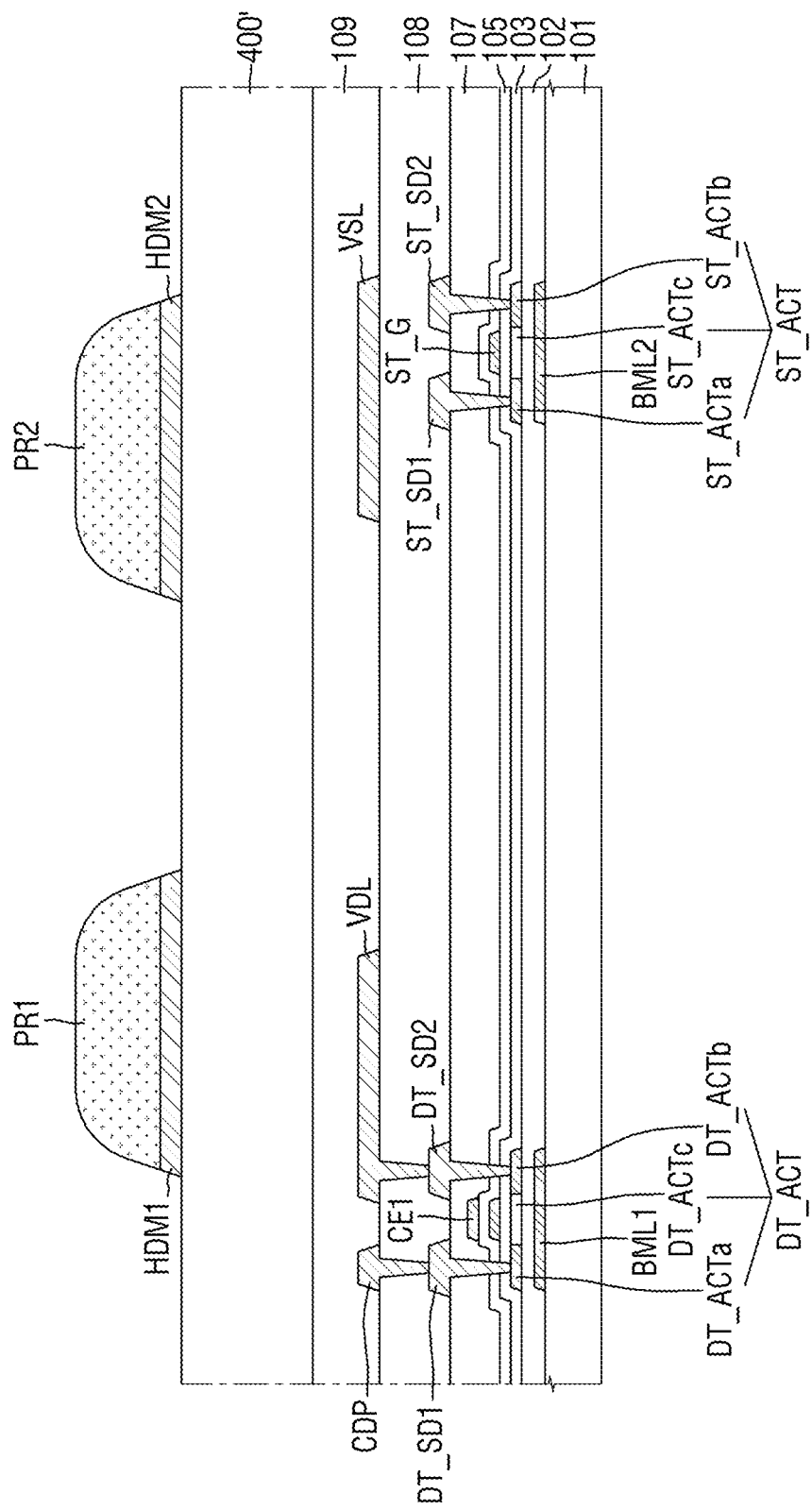
Figure 12:
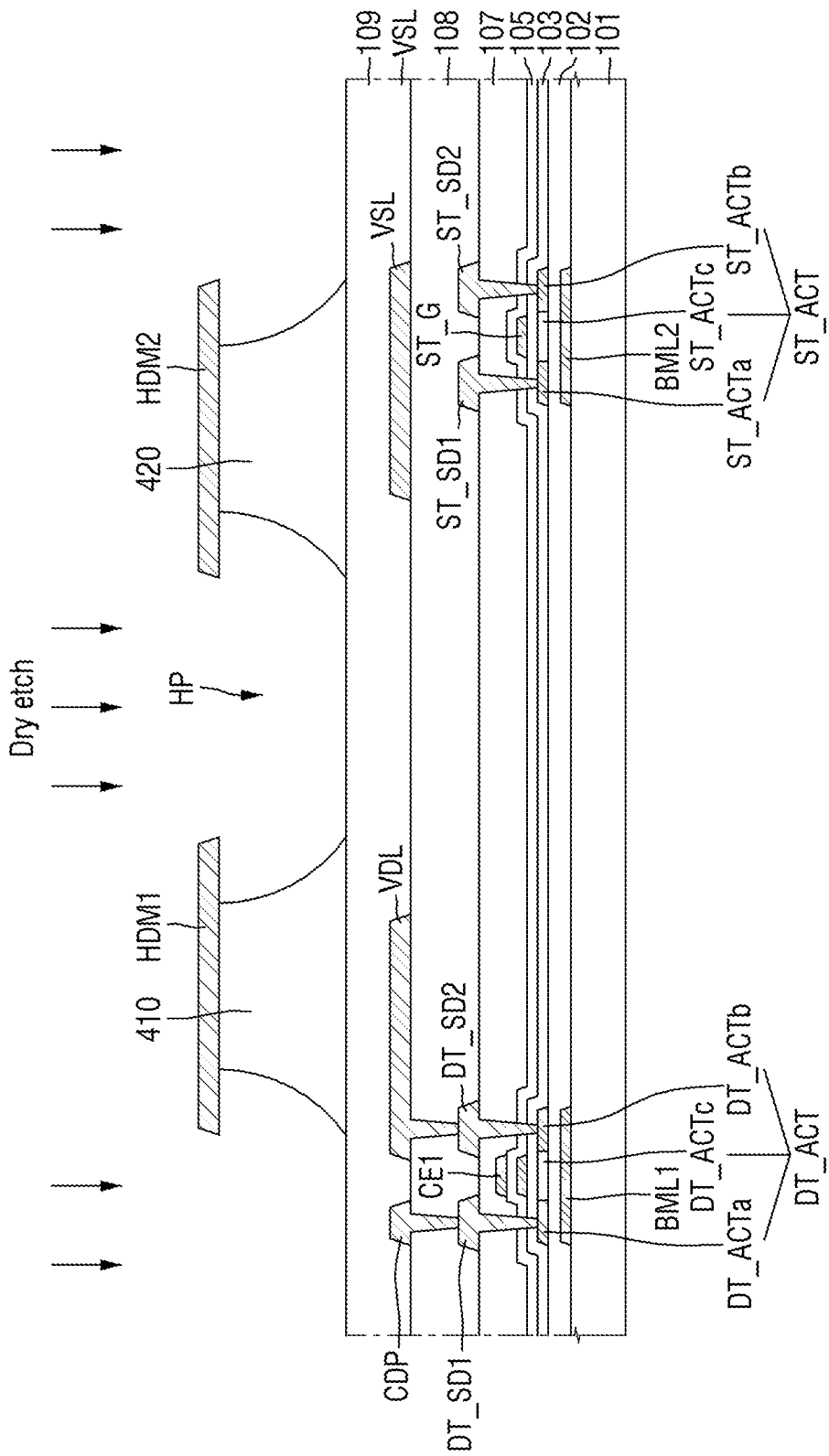

Next, referring to FIGS. 11 and 12, a portion of the bank insulating layer 400' is etched to form the first inner bank 410 and the second inner bank 420.

First, referring to FIG. 11, hard mask layers HDM1 and HDM2 spaced apart from each other, and photoresist layers PR1 and PR2 respectively on the hard mask layers HDM1 and HDM2, are formed on the bank insulating layer 400'. The hard mask layers HDM1 and HDM2 may include a first hard mask layer HDM1 to correspond to an area where the first inner bank 410 is to be formed and a second hard mask layer HDM2 to correspond to an area where the second inner bank 420 is to be formed. Like the inner banks 410 and 420, the first hard mask layer HDM1 and the second hard mask layer HDM2 may be spaced apart to face each other (in the first direction DR1). For example, the hard mask layers HDM1 and HDM2 may each independently include a metal or a material such as ITO and/or IZO.

The photoresist layers PR1 and PR2 may include a first photoresist layer PR1 on the first hard mask layer HDM1 and a second photoresist layer PR2 on the second hard mask layer HDM2. The photoresist layers PR1 and PR2 may be removed at the same time as when the bank insulating layer 400' is etched in a subsequent process, and may prevent or protect the hard mask layers HDM1 and HDM2 from being etched.

After the hard mask layers HDM1 and HDM2 and the photoresist layers PR1 and PR2 are formed, the bank insulating layer 400' is etched to form the first inner bank 410 and the second inner bank 420. Referring to FIG. 12, according to an embodiment, the bank insulating layer 400' may be dry-etched to form the inner banks 410 and 420 during the manufacturing process of the display device 10. When the bank insulating layer 400' is patterned using dry etching instead of using photoresist, materials that form the bank insulating layer 400' may be isotropically etched. In this case, undercuts may occur in the bank insulating layer 400' located under the hard mask layers HDM1 and HDM2, and side surfaces of the inner banks 410 and 420 formed by etching the bank insulating layer 400' may be curved, as illustrated in FIG. 12. Widths of upper surfaces of the inner banks 410 and 420 may be smaller than those of the hard mask layers HDM1 and HDM2, due to the undercuts resulting from the dry etching. The inner banks 410 and 420 may become narrower from the upper surfaces toward middle portions of inner banks 410 and 420, while their side surfaces PS1 and PS2 (see FIG. 4) are recessed toward their centers to have a curved shape, during isotropic etching.

Light emitting elements 300 may be placed in an opening area HP formed between the inner banks 410 and 420 as a result of etching the bank insulating layer 400'. Light emitted from the light emitting elements 300 may travel toward the curved side surfaces of the inner banks 410 and 420 and may be concentrated with improved efficiency as described above with reference to FIG. 5.

Figure 13:
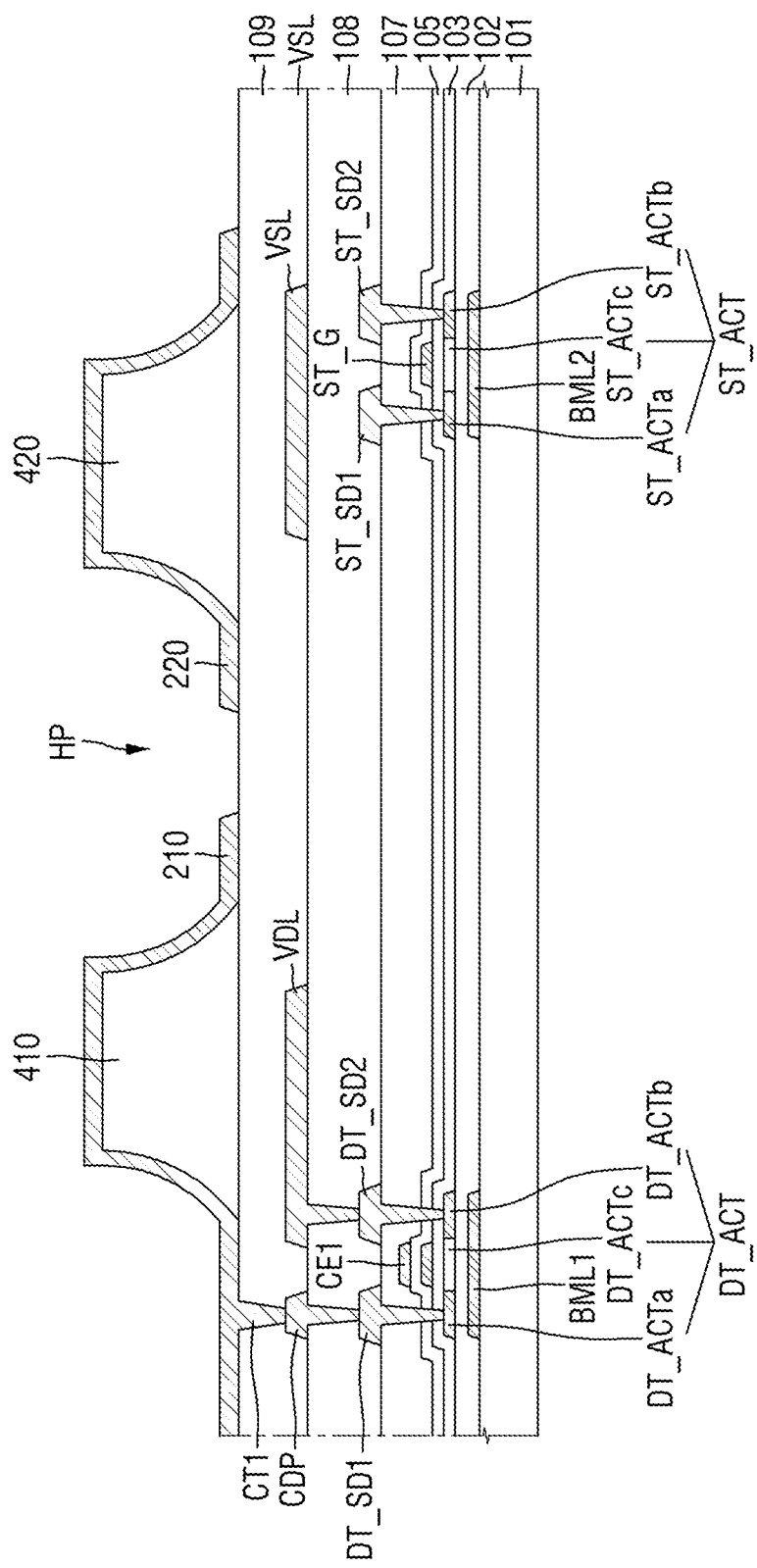

Next, referring to FIG. 13, a first electrode 210 and a second electrode 220 are formed on the first inner bank 410 and the second inner bank 420, respectively. The first electrode 210 and the second electrode 220 are the same as those described above. A process of forming the first contact hole CT1 and the second contact hole CT2 that penetrate the first planarization layer 109 and expose parts of the second data conductive layer may be performed before the first electrode 210 and the second electrode 220 are formed. The first electrode 210 and the second electrode 220 may be formed by first forming an electrode conductive layer to cover the first planarization layer 109 and the inner banks 410 and 420, and then partially patterning the electrode conductive layer.

Figure 14:
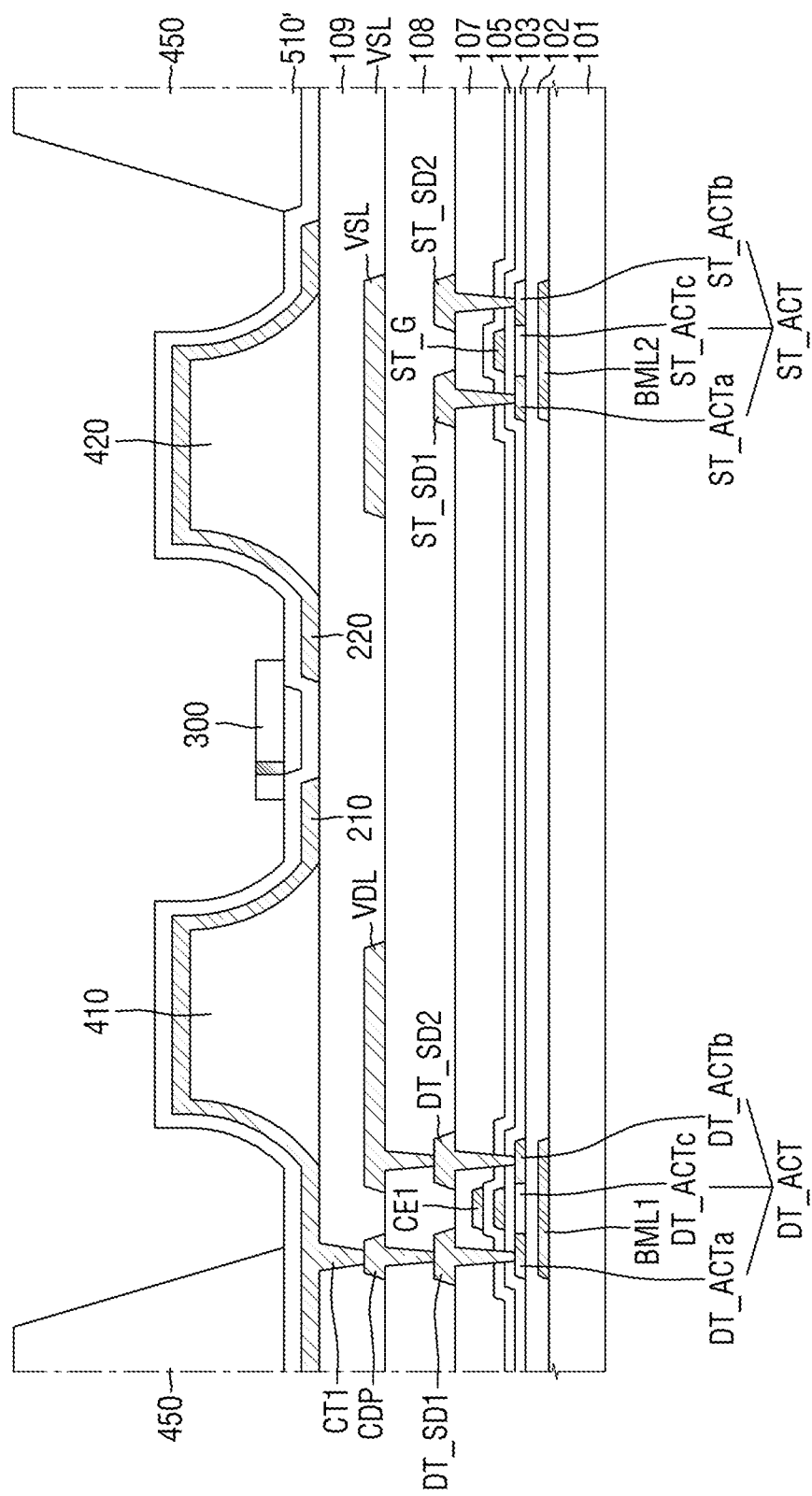

Next, referring to FIG. 14, a first insulating material layer 510' is formed to cover the first electrode 210 and the second electrode 220, and an outer bank 450 is formed on the first insulating material layer 510'. Then, the light emitting elements 300 are aligned in the opening area HP formed between the first inner bank 410 and the second inner bank 420, and are positioned on the first insulating material layer 510' between the first electrode 210 and the second electrode 220. The outer bank 450 may be positioned at a boundary of each subpixel PXn as described above. The first insulating material layer 510' may be on the first planarization layer 109 to entirely cover the first electrode 210 and the second electrode 220, and may be partially patterned in a subsequent process to form the first insulating layer 510 of FIG. 3.

According to embodiments, the light emitting elements 300 dispersed in an ink may be sprayed onto each pixel PX or subpixel PXn through an inkjet process, and may be aligned between the first electrode 210 and the second electrode 220 through a process of forming an electric field E between the first electrode 210 and the second electrode 220. When an alignment signal is transmitted to the first electrode 210 and the second electrode 220 after the ink in which the light emitting elements 300 are dispersed is sprayed onto the first electrode 210 and the second electrode 220, an electric field may be formed between the electrodes 210 and 220, and a dielectrophoretic force may be applied to the light emitting elements 300 dispersed in the ink by the electric field. The dielectrophoretic force applied to the light emitting elements 300 may change the orientation direction and position of the light emitting elements 300 in the ink, thereby aligning the light emitting elements 300 between the first electrode 210 and the second electrode 220.

Here, the outer bank 450 may prevent or reduce overflow of the ink sprayed onto the first electrode 210 and the second electrode 220 to other subpixels PXn.

Next, after a second insulating layer 520 is formed on the light emitting elements 300, the first insulating material layer 510' is patterned to form the first insulating layer 510. The first insulating material layer 510' may be patterned to partially expose upper surfaces of the first electrode 210 and the second electrode 220, thereby forming the first insulating layer 510. Then, a first contact electrode 261, a third insulating layer 530, a second contact electrode 262, and a fourth insulating layer 550 are formed on the light emitting elements 300, and the first and second electrodes 210 and 220 to complete the display device 10.

According to an embodiment, the first inner bank 410 and the second inner bank 420 of the display device 10 may be formed by dry-etching the bank insulating layer 400'. The material that forms the bank insulating layer 400' may be isotropically etched using dry etching, and undercuts may occur under the hard mask layers HDM1 and HDM2 as a result of the isotropic etching. Accordingly, the facing side surfaces PS1 and PS2 of the first inner bank 410 and the second inner bank 420 may be curved, for example, may be concavely recessed toward the centers of the inner banks 410 and 420, respectively. In the display device 10 according to an embodiment, the light emitting elements 300 are arranged between the inner banks 410 and 420 having the above shape. Thus, of the light emitted from the light emitting elements 300, the amount of light reflected by the electrodes 210 and 220 may increase, while the light concentration efficiency is improved, due to the shape of each of the inner banks 410 and 420.

Various embodiments of the display device 10 will now be described in more detail.

Figure 15:
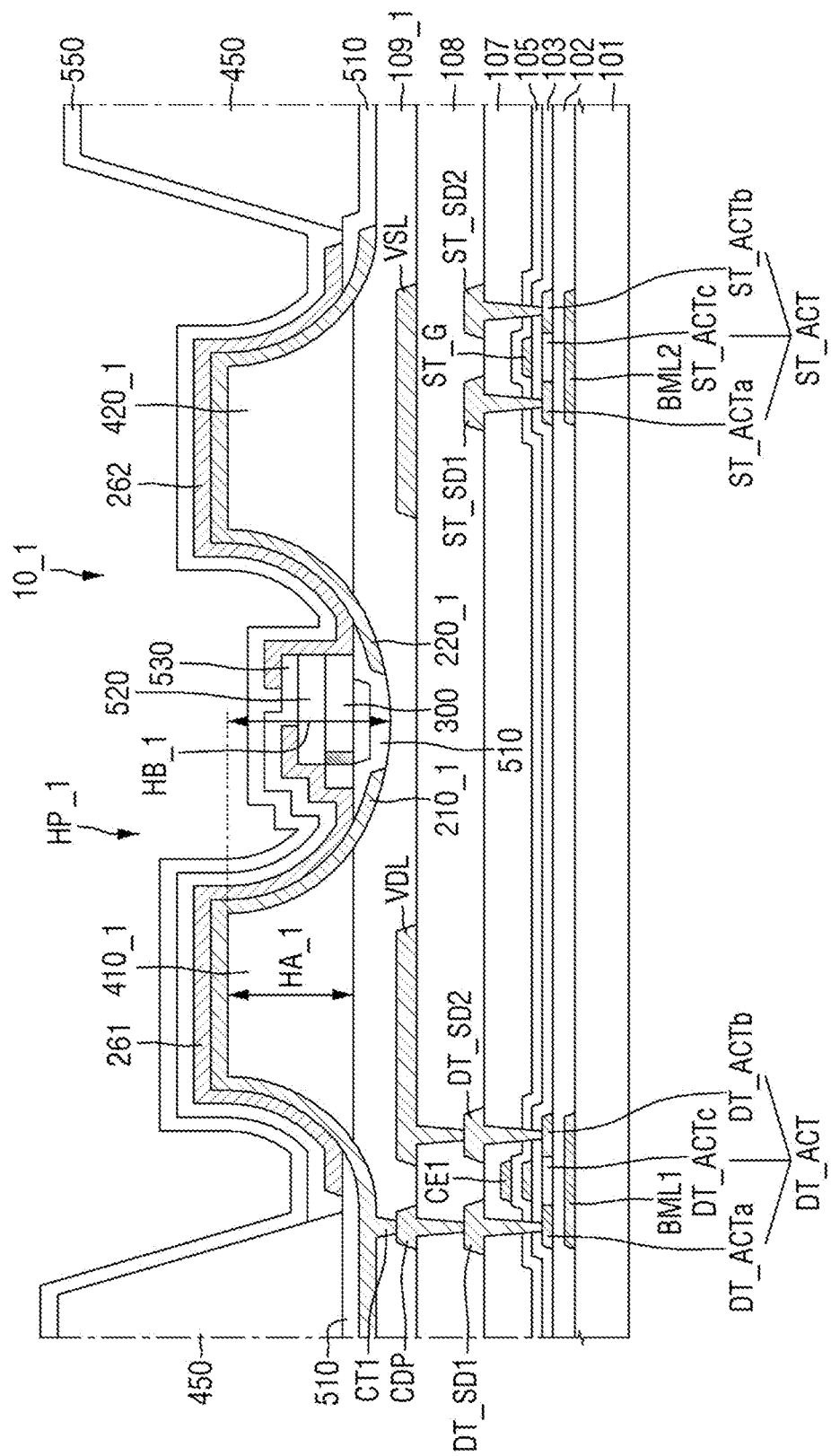
FIG. 15 is a cross-sectional view of a display device according to an embodiment.

FIG. 15 is a cross-sectional view of a display device 10_1 according to an embodiment.

Referring to FIG. 15, in the display device 10_1 according to an embodiment, a portion of an upper surface of a first planarization layer 109_1 may be etched during a process of forming inner banks 410_1 and 420_1, and a light emitting element 300 may be located further down toward the substrate 101. The current embodiment is the same as the embodiment of FIG. 3, except that a portion of the upper surface of the first planarization layer 109_1 is etched. Although a portion where a second contact hole CT2 is formed is not illustrated in FIG. 15, the second contact hole CT2 is the same as that described above with reference to FIG. 3. The following description will focus on differences, and any redundant descriptions will not be provided.

In the display device 10_1 of FIG. 15, a portion of the upper surface of the first planarization layer 109_1 may be etched, except for areas where a first inner bank 410_1 and a second inner bank 420_1 are positioned. Accordingly, a depth HB_1 of an opening area HP_1 formed between the first inner bank 410_1 and the second inner bank 420_1 may be greater than a height HA_1 of each of the inner banks 410_1 and 420_1.

As described above, the inner banks 410_1 and 420_1 may include the same material as the first planarization layer 109_1 and a second interlayer insulating layer 108, and a portion of the first planarization layer 109_1 may be etched by drying etching (see FIG. 12) during a manufacturing process of the display device 10_1. A portion of a bank insulating layer 400' formed on the first planarization layer 109_1 may remain as the inner banks 410_1 and 420_1, and the other portion may be etched at the same time as the portion of the first planarization layer 109_1. For example, the opening area HP_1 in which the light emitting element 300 is may be formed between the first inner bank 410_1 and the second inner bank 420_1, and the depth HB_1 of the opening area HP_1 may be greater than the height HA_1 of each of the inner banks 410_1 and 420_1. Accordingly, a portion of a lower surface of a first insulating layer 510 positioned in the opening area HP_1 may directly contact the first planarization layer 109. In some embodiments, the light emitting element 300 may be located on the same layer as lower surfaces of the inner banks 410_1 and 420_1, or may be located lower than the lower surfaces of the inner banks 410_1 and 420_1 (e.g., a lower surface of the light emitting element 300 may be below the lower surfaces of the inner banks 410_1 and 420_1), and the amount of light emitted from the light emitting element 300 and travelling toward side surfaces of the inner banks 410_1 and 420_1 may be further increased.

In the drawings, the opening area HP_1 is formed up to the first planarization layer 109_1, that is, a lower surface of the opening area HP_1 is located on the same layer as the first planarization layer 109_1. However, embodiments are not limited to this case. In some embodiments, a portion of the upper surface of the first planarization layer 109_1 may be etched up to the second interlayer insulating layer 108, or a first interlayer insulating layer 107, during the manufacturing process of the display device 10_1, so that the lower surface of the opening area HP_1 is located on the same layer as the second interlayer insulating layer 108 or the first interlayer insulating layer 107.

Figure 16:
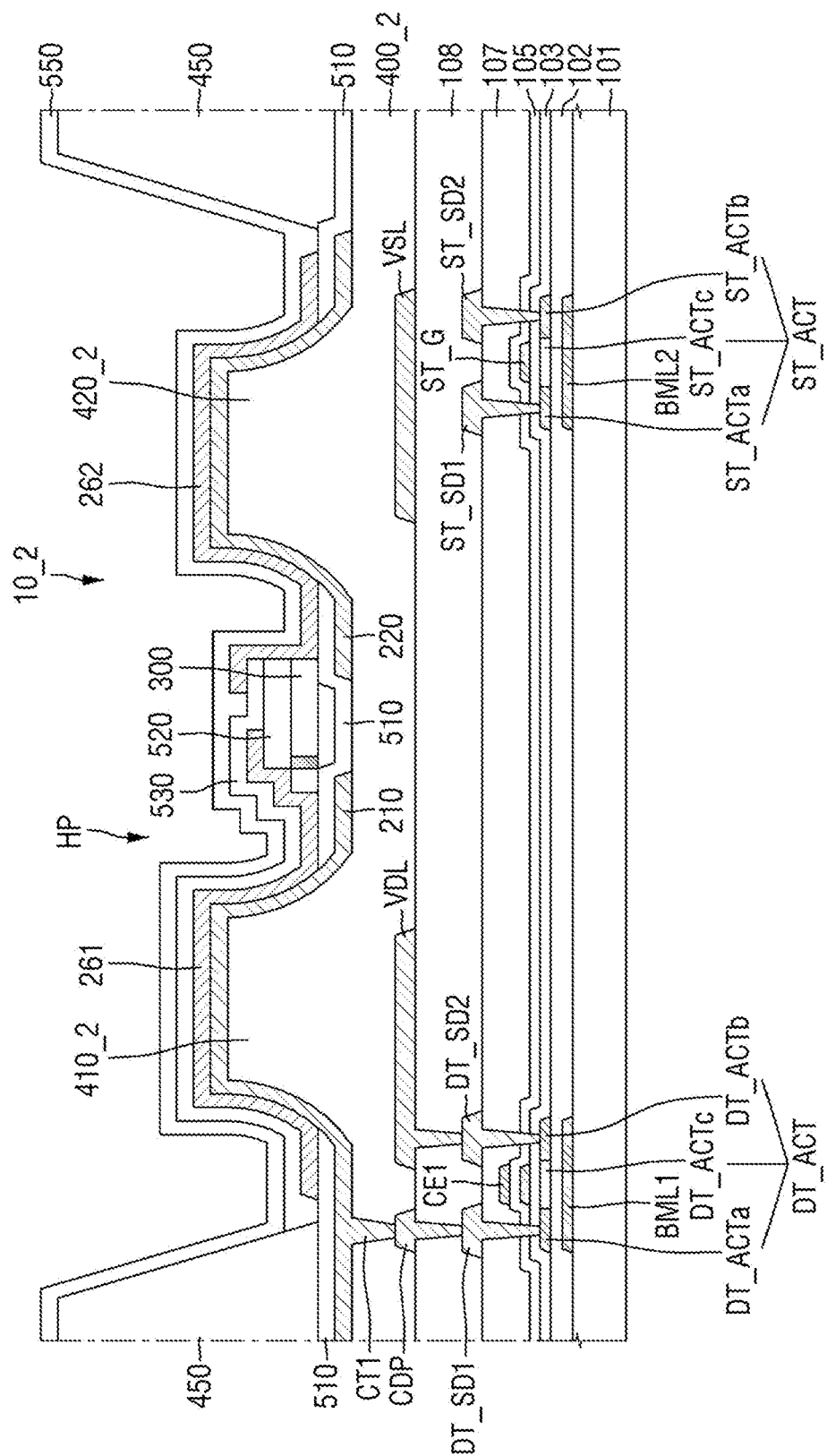
FIG. 16 is a cross-sectional view of a display device according to an embodiment.

FIG. 16 is a cross-sectional view of a display device 10_2 according to an embodiment.

Referring to FIG. 16, the display device 10_2 according to an embodiment may not include a first planarization layer 109, and may include a bank layer 400_2, which is on a second data conductive layer and which includes a first inner bank 410_2 and a second inner bank 420_2. The current embodiment is different from the embodiment of FIG. 3 in that the first planarization layer 109 is omitted, and the bank layer 400_2 is provided. Although a portion where a second contact hole CT2 is formed is not illustrated in FIG. 16, the second contact hole CT2 is the same as that described above with reference to FIG. 3. The following description will focus on differences, and any redundant descriptions will not be provided.

As described above, the inner banks 410_2 and 420_2 may include the same material as the first planarization layer 109 of the embodiment of FIG. 3. Therefore, the inner banks 410_2 and 420_2 may be integrated with the first planarization layer 109 to form one bank layer 400_2. The display device 10_2 of FIG. 16 may include the first inner bank 410_2 and the second inner bank 420_2, each having a protruding part, as the bank layer 400_2 directly on the second data conductive layer and a second interlayer insulating layer 108 (e.g., the first inner bank 410_2 and the second inner bank 420_2 may protrude from the bank layer 400_2). The display device 10_2 of FIG. 16 is different from the display device 10 of FIG. 3 in that the first inner bank 410 and the second inner bank 420 of FIG. 3 are integrated with the first planarization layer 109.

The bank layer 400_2 may be entirely on the second data conductive layer and the second interlayer insulating layer 108 and may include protruding structures. The protruding structures may be the first inner bank 410_2 and the second inner bank 420_2 described above, which may have substantially the same shape as those of FIG. 3.

In some embodiments, each of the first inner bank 410_2 and the second inner bank 420_2 may have a height measured from an upper surface of the second interlayer insulating layer 108, and the height of each of the inner banks 410_2 and 420_2 may be greater than a depth of an opening area HP between the inner banks 410_2 and 420_2. However, embodiments are not limited to this case.

In the embodiment of FIG. 16, the number of manufacturing processes can be reduced because a separate first planarization layer 109 from the bank layer 400_2 is omitted.

Figure 17:
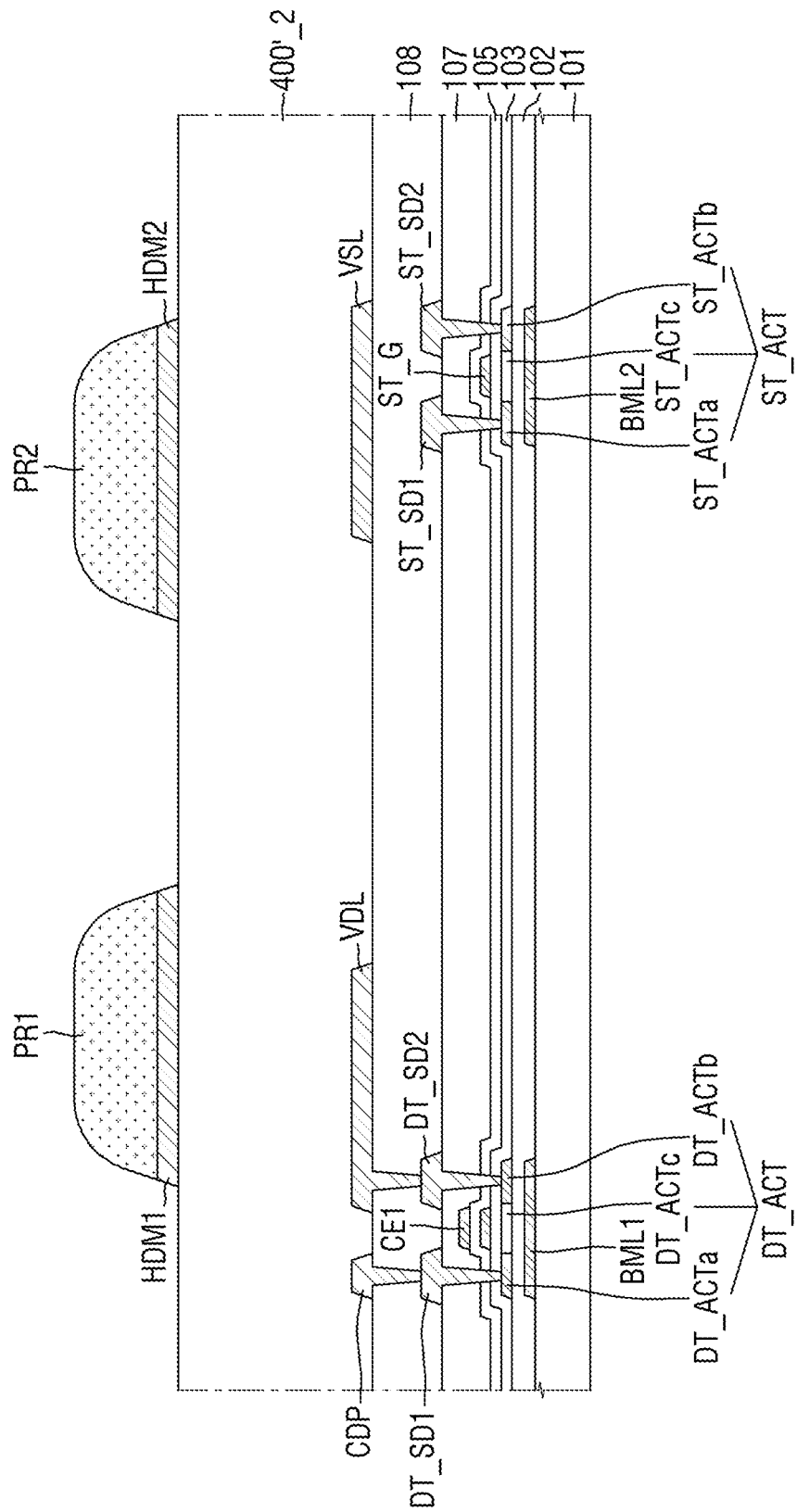
FIG. 17 is a cross-sectional view illustrating a portion (e.g., one or more acts) of a process of manufacturing the display device of FIG. 16.

FIG. 17 is a cross-sectional view illustrating portion of a process of manufacturing the display device 10_2 of FIG. 16.

Referring to FIG. 17, during the manufacturing process of the display device 10_2, a bank insulating layer 400'_2 may be directly placed on the second data conductive layer and the second interlayer insulating layer 108. A portion of the bank insulating layer 400'_2 may be isotropically etched to form protruding structures, that is, the first inner bank 410_2 and the second inner bank 420_2.

Here, an area between the first inner bank 410_2 and the second inner bank 420_2 formed by etching the bank insulating layer 400'_2 may be an opening area HP, and a light emitting element 300 may be placed in the opening area HP. In addition, if the opening area HP is formed to be spaced apart from the upper surface of the second interlayer insulating layer 108 in a process of etching the bank insulating layer 400'_2, a depth HB of the opening area HP may be smaller than a height HA of each of the inner banks 410_2 and 420_2. Other details and elements are the same as those described above.

In the display device 10, when the first planarization layer 109 is omitted and a bank layer 400 is directly placed on the second data conductive layer, a groove OP_3 (see FIG. 18) may be formed during the manufacturing process of the display device 10, so that a portion of the bank insulating layer 400' is recessed, and the light emitting elements 300 may be placed in the groove OP_3. In this case, the bank layer 400 may include the groove and the inner banks 410 and 420 spaced apart from each other with respect to the groove, and only one side surface of each of the inner banks 410 and 420 may have a curved shape.

Figure 18:
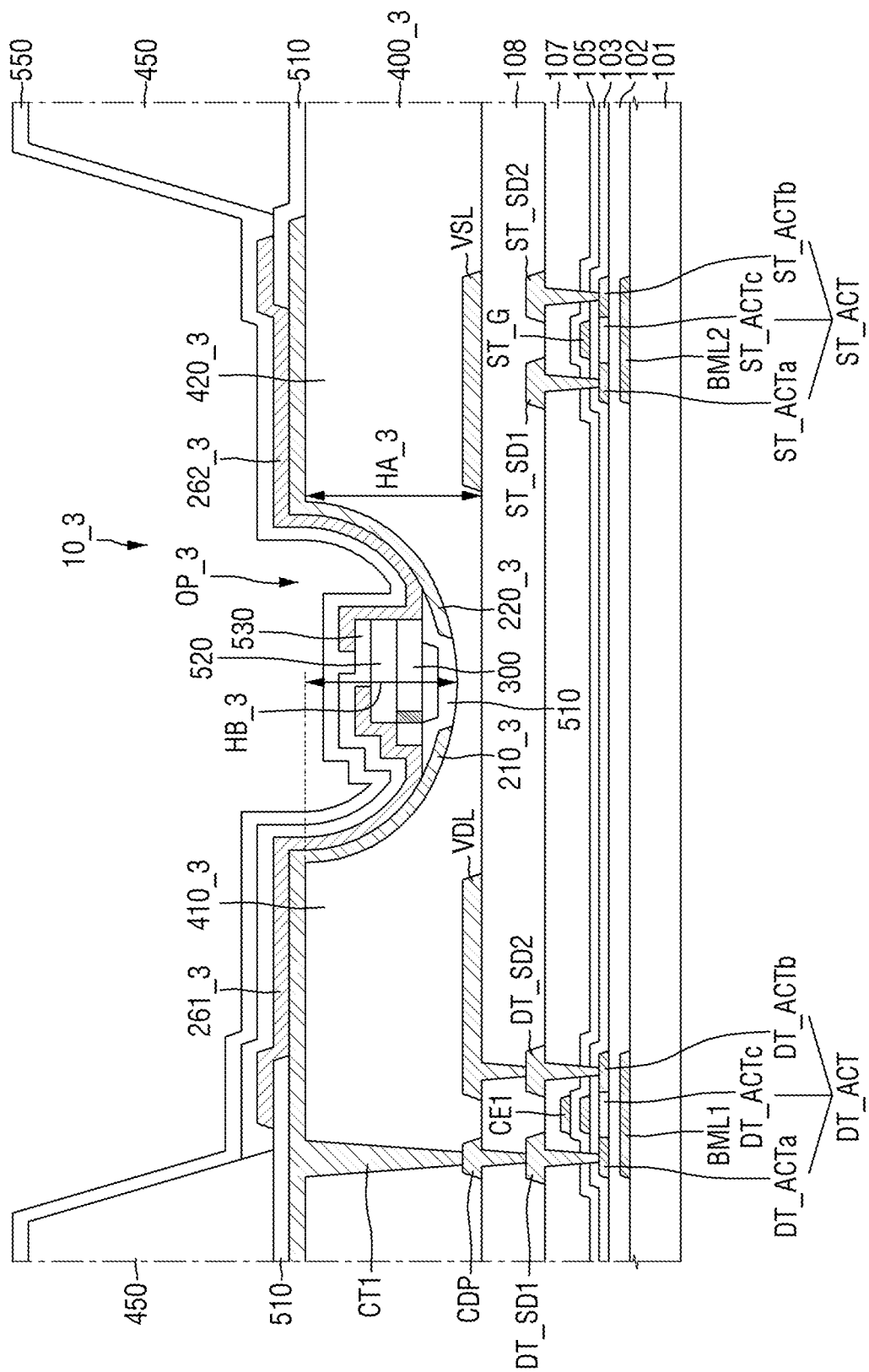
FIG. 18 is a cross-sectional view of a display device according to an embodiment.

FIG. 18 is a cross-sectional view of a display device 10_3 according to an embodiment.

Referring to FIG. 18, the display device 10_3 according to an embodiment may include a bank layer 400_3 on a second data conductive layer, and the bank layer 400_3 may include the groove OP_3 (formed by recessing at least a portion of the bank layer 400_3) and a first inner bank 410_3 and a second inner bank 420_3 separated by the groove OP_3. The current embodiment is different from the embodiment of FIG. 16 in the shape of the bank layer 400_3. The differences of the current embodiment will now be described, and redundant descriptions of the same elements will not be provided.

The display device 10_3 of FIG. 18 includes the bank layer 400_3 on the second data conductive layer. The bank layer 400_3 may include the groove OP_3 formed by recessing at least a portion of the bank layer 400_3, and may include the first inner bank 410_3 and the second inner bank 420_3 spaced apart from each other with respect to the groove OP_3. The groove OP_3 may be formed by isotropically etching a portion of a bank insulating layer 400' during a manufacturing process of the display device 10_3, and may contact a side surface of each of the first inner bank 410_3 and the second inner bank 420_3. For example, both sidewalls of the groove OP_3 may be the respective side surfaces of the first inner bank 410_3 and the second inner bank 420_3 and may have a curved shape. Both sidewalls of the groove OP_3 may have substantially the same shape as the side surfaces PS1 and PS2 of the first inner bank 410 and the second inner bank 420 described above with reference to FIG. 4. A first electrode 210_3 and a second electrode 220_3 may be arranged on the first inner bank 410_3 and the second inner bank 420_3, respectively, and at least a portion of each of the first electrode 210_3 and the second electrode 220_3 may be in the groove OP_3.

Although a portion where a second contact hole CT2 is formed is not illustrated in FIG. 18, the second contact hole CT2 is substantially the same as that described above with reference to FIG. 3. For example, the second contact hole CT2 may be formed in a portion (area IV-IV' of FIG. 3) of the bank layer 400_3 which is overlapped by an outer bank 450. Other details and elements are the same as those described above, and thus redundant descriptions thereof will not be provided.

In the display device 10_3 of FIG. 18, the inner banks 410_3 and 420_3 may be formed by etching only a portion of the bank insulating layer 400'. For example, the inner banks 410_3 and 420_3 may not form a separate structure, but may substantially be parts of (e.g., included in) the bank layer 400_3.

Figure 19:
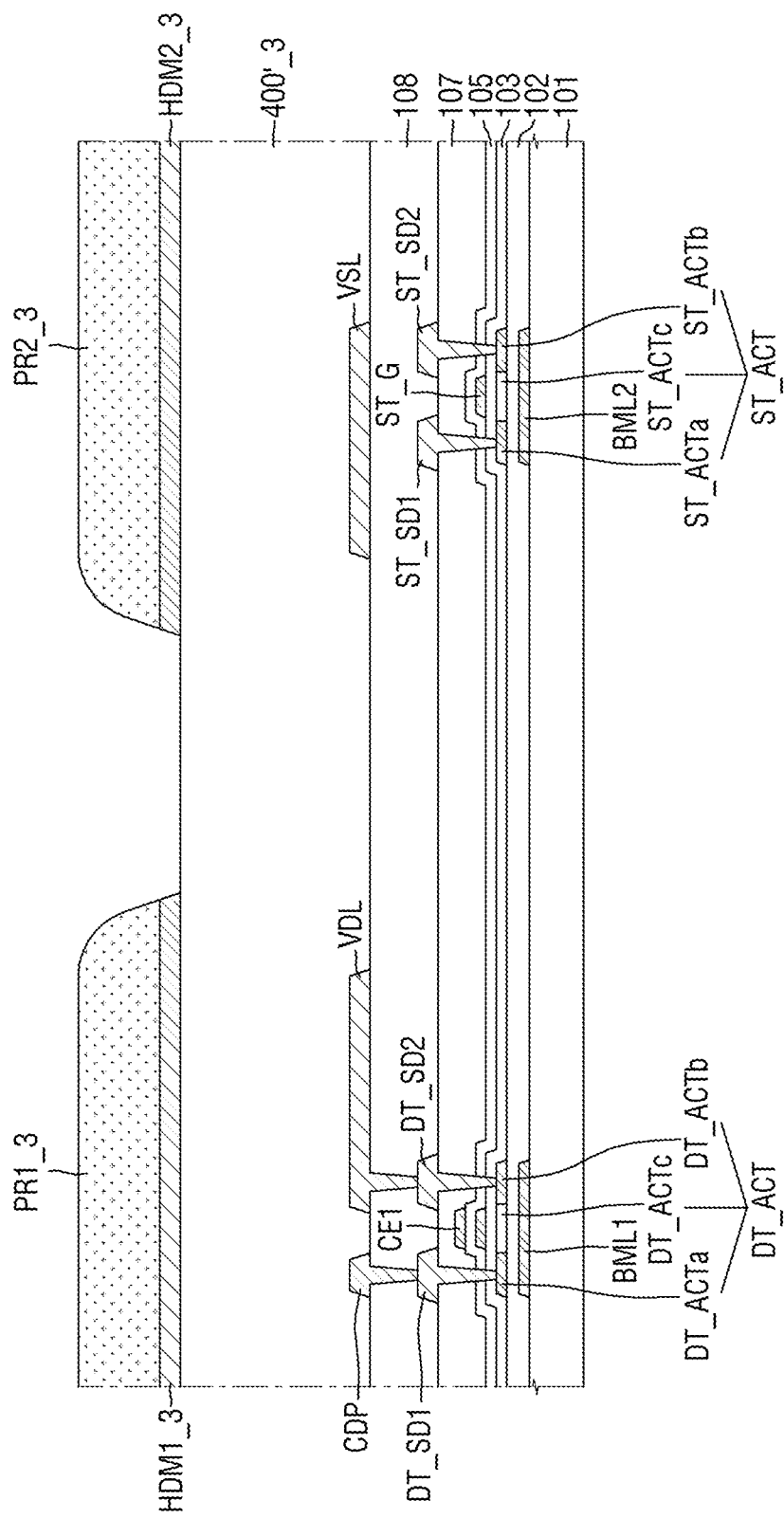
FIGS. 19 and 20 are cross-sectional views illustrating a portion (e.g., one or more acts) of a process of manufacturing the display device of FIG. 18.
Figure 20:
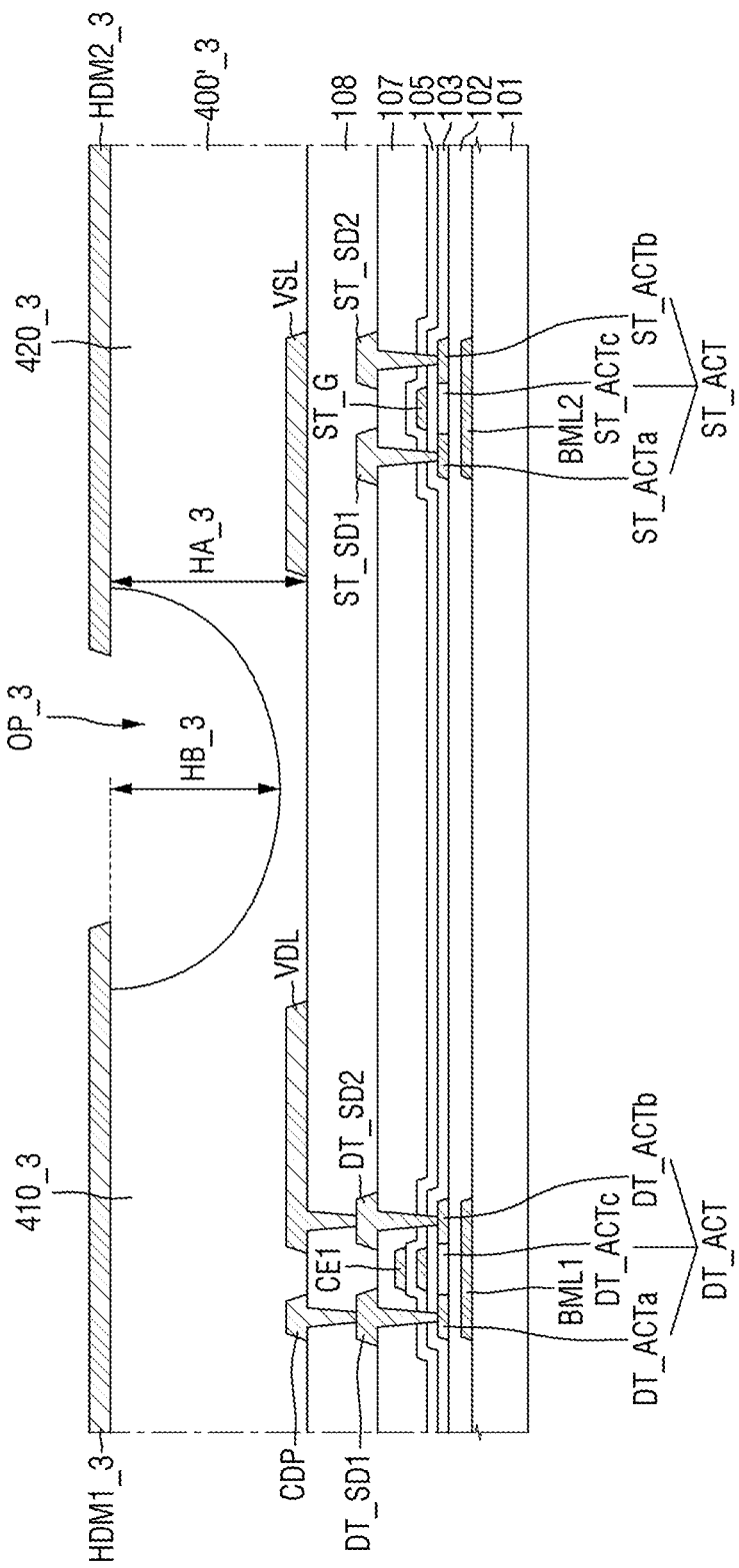

FIGS. 19 and 20 are cross-sectional views illustrating portion of a process of manufacturing the display device 10_3 of FIG. 18.

Referring to FIGS. 19 and 20, during the manufacturing process of the display device 10_3, a bank insulating layer 400'_3 is formed on the second data conductive layer, and hard mask layers HDM1_3 and HDM2_3 are placed on the bank insulating layer 400'_3. Photoresist layers PR1_3 and PR2_3 are formed on the hard mask layers HDM1_3 and HDM2_3, respectively. These members are substantially the same as those described above with reference to FIG. 11.

A first hard mask layer HDM1_3 and a second hard mask layer HDM2_3 may be spaced apart from each other, and a portion of the bank insulating layer 400'_3, which is exposed between the first hard mask layer HDM1_3 and the second hard mask layer HDM2_3 spaced apart from each other, may be isotropically etched. As illustrated in FIG. 20, the isotropic etching may create an undercut in an area between the hard mask layers HDM1_3 and HDM2_3, thereby forming the groove OP_3 having curved sidewalls. A portion of the bank layer 400_3 on a side of the groove OP_3 may be formed as the first inner bank 410_3, and the other portion of the bank layer 400_3 on an opposite side of the groove OP_3 may be formed as the second inner bank 420_3.

Unlike in the display device 10 of FIG. 3, the respective side surfaces of the inner banks 410_3 and 420_3 may be spaced to face each other with respect to the groove OP_3, and an upper surface of the bank layer 400_3 may form a flat surface except for the groove OP_3. According to an embodiment, the first electrode 210_3 and the second electrode 220_3 may be on the bank layer 400_3 and spaced apart from each other in the groove OP_3, and the outer bank 450 may be placed on the flat upper surface of the bank layer 400_3. For example, an upper surface of the outer bank 450 may be formed higher than (e.g., above) a light emitting element 300.

In some embodiments, the first electrode 210_3 and the second electrode 220_3 may contact the second data conductive layer respectively through a first contact hole CT1 and the second contact hole CT2 penetrating the bank layer 400_3. According to an embodiment, during the manufacturing process of the display device 10_3, the first contact hole CT1 and the second contact hole CT2 may be formed in the same process and at the same time as the groove OP_3.

Figure 21:
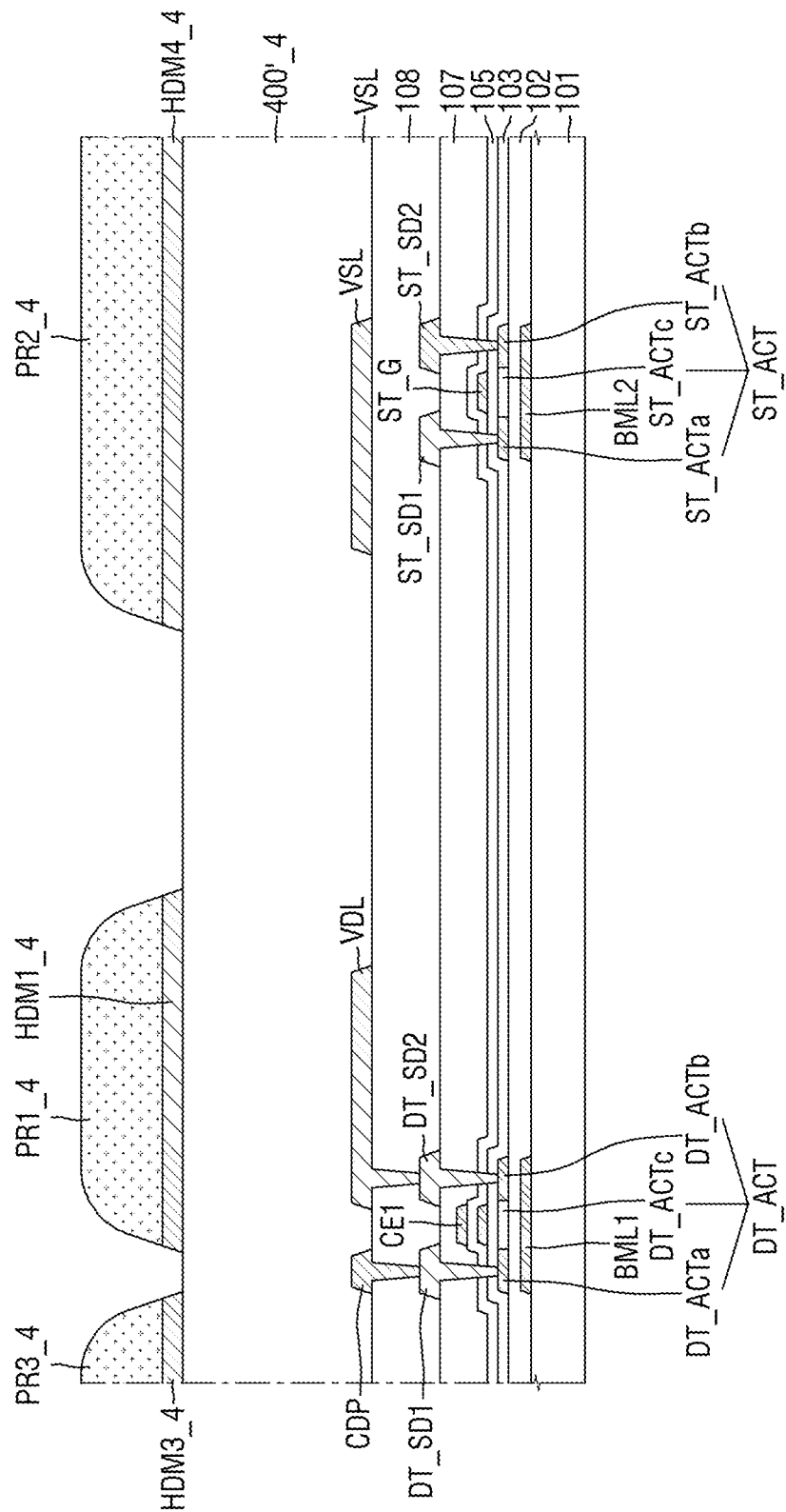
FIGS. 21 and 22 are cross-sectional views illustrating a portion (e.g., one or more acts) of a process of manufacturing a display device according to an embodiment.
Figure 22:
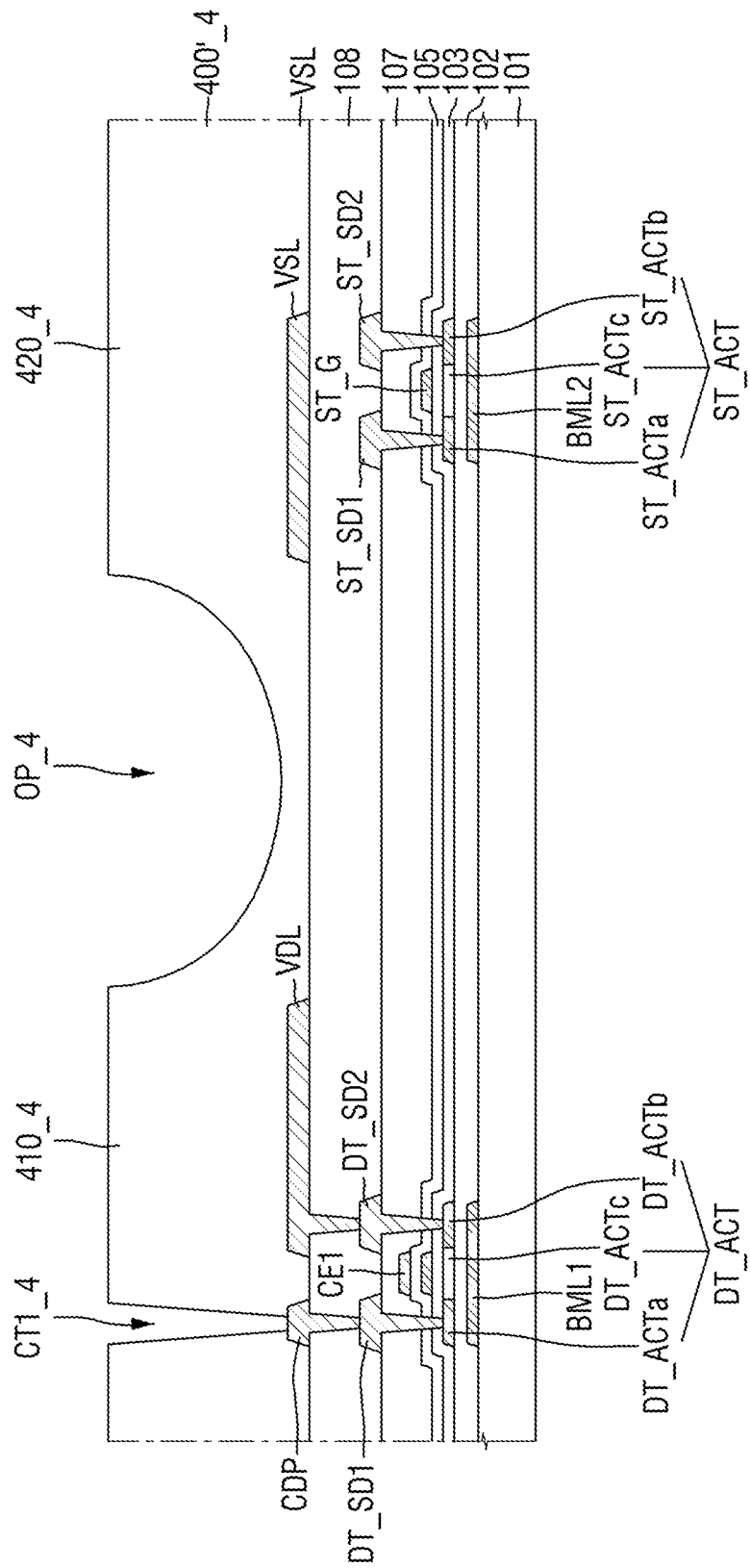

FIGS. 21 and 22 are cross-sectional views illustrating a portion of a process of manufacturing a display device 10_4 according to an embodiment.

Referring to FIGS. 21 and 22, during the manufacturing process of the display device 10_4, a bank insulating layer 400'_4 is formed on a second data conductive layer, and a larger (e.g., larger than 2) number of hard mask layers HDM1_4, HDM2_4 and HDM3_4 are placed on the bank insulting layer 400'_4. Photoresist layers PR1_4, PR2_4 and PR3_4 are formed on the hard mask layers HDM1_4, HDM2_4 and HDM3_4, respectively. The hard mask layers HDM1_4, HDM2_4, and HDM3_4 may include a third hard mask layer HDM3_4 spaced apart from a first hard mask layer HDM1_4, in addition to the first hard mask layer HDM1_4 and a second hard mask layer HDM2_4. The photoresist layers PR1_4, PR2_4 and PR3_4 may include a third photoresist layer PR3_4 formed on the third hard mask layer HDM3_4, in addition to a first photoresist layer PR1_4 and a second photoresist layer PR2_4. These members are substantially the same as those described above with reference to FIG. 19.

The first hard mask layer HDM1_4 and the third hard mask layer HDM3_4 may be spaced apart from each other on the bank insulating layer 400'_4, and a portion of the bank insulating layer 400'_4, which is exposed between the first hard mask layer HDM1_4 and the third hard mask layer HDM3_4 spaced apart from each other, may be etched to form a first contact hole CT1_4. In addition, the second hard mask layer HDM2_4 may be spaced apart from another hard mask layer on the bank insulating layer 400'_4, and a portion of the bank insulating layer 400'_4, which is exposed between the second hard mask layer HDM2_4 and the other hard mask layer, may be etched to form a second contact hole CT2.

As illustrated in FIG. 22, parts of the bank insulating layer 400'_4, which are exposed between the hard mask layers HDM1_4, HDM2_4 and HDM3_4 spaced apart from each other, may be etched to form a groove OP_4 and the first contact hole CT1_4. In the display device 10_4 not including a first planarization layer 109 and including one bank layer 400_4, contact holes CT1_4 penetrating the bank layer 400_4 may be simultaneously (or concurrently) formed in a process of forming the groove OP_4 and/or inner banks 410_4 and 420_4.

Referring again to FIG. 18, a thickness of the bank layer 400_3 may be equal to a height HA_3 of each of the first inner bank 410_3 and the second inner bank 420_3. According to an embodiment, a depth HB_3 of the groove OP_3 may be smaller than the height HA_3 of each of the inner banks 410_3 and 420_3. Accordingly, the first inner bank 410_3 and the second inner bank 420_3 may be coupled to each other to form one bank layer 400_3 while being partially spaced apart from each other.

In a process of forming the bank layer 400_3, the depth HB_3 of the groove OP_3 may vary depending on process conditions of a dry etching process. As illustrated in FIG. 18, the depth HB_3 of the groove OP_3 may be smaller than the thickness of the bank layer 400_3 or the height HA_3 of each of the inner banks 410_3 and 420_3, and the light emitting element 300 may be located on the second data conductive layer. However, embodiments are not limited to this case, and the depth HB_3 of the groove OP_3 may also be substantially equal to or greater than the thickness of the bank layer 400_3. In this case, the light emitting element 300 may be located on the same layer as a second interlayer insulating layer 108, the second data conductive layer, and/or a first data conductive layer.

Figure 23:
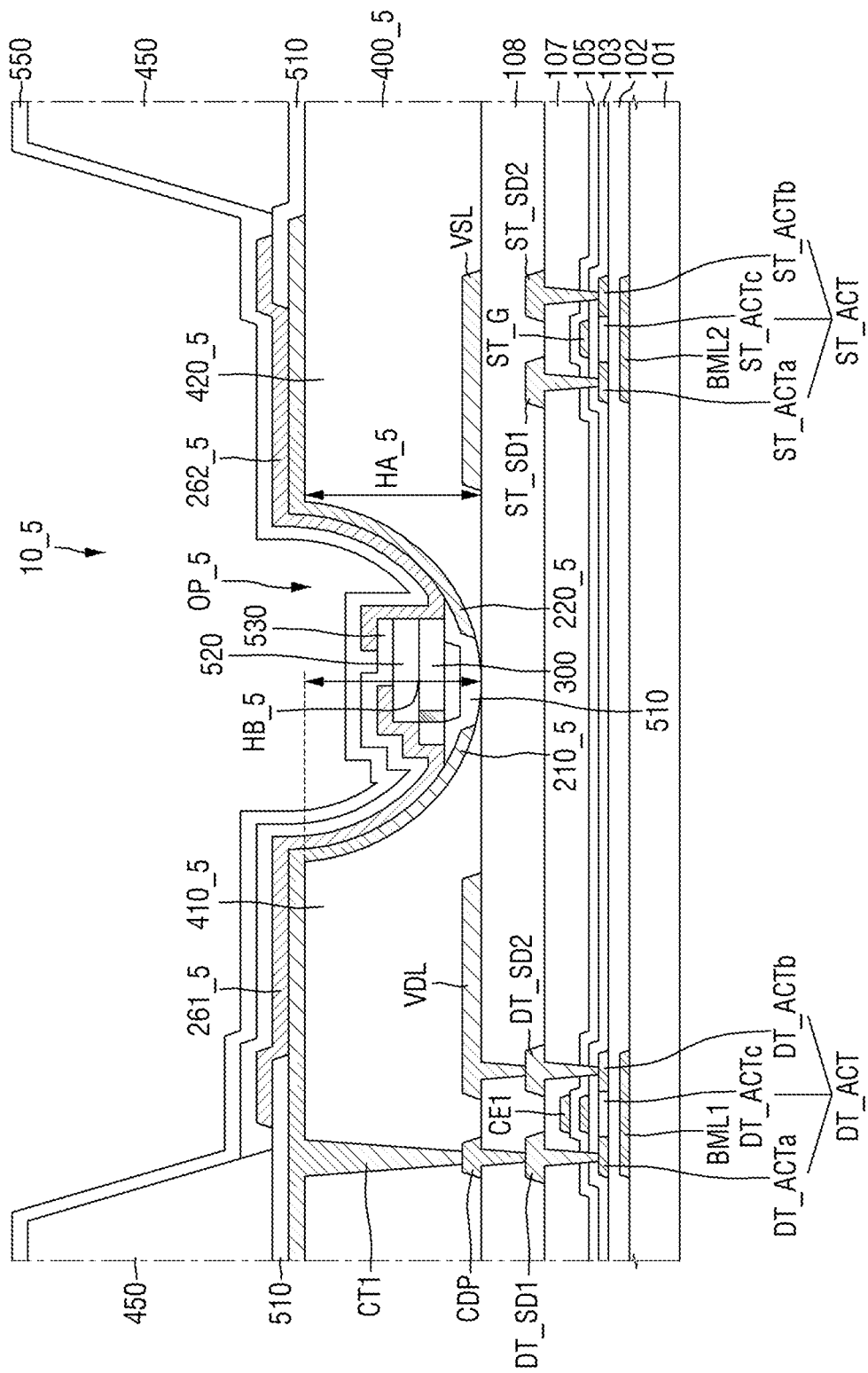
FIG. 23 is a cross-sectional view of a display device according to an embodiment.

FIG. 23 is a cross-sectional view of a display device 10_5 according to an embodiment.

Referring to FIG. 23, in the display device 10_5 according to an embodiment, a depth HB_5 of a groove OP_5 of a bank layer 400_5 may be substantially equal to a thickness of the bank layer 400_5 and/or a height HA_5 of each inner bank 410_5 or 420_5. The current embodiment is different from the embodiment of FIG. 18 in the depth HB_5 of the groove OP_5. The following description will focus on the differences, and any redundant descriptions will not be provided.

In the display device 10_5 of FIG. 23, a lower surface of the groove OP_5 may contact an upper surface of a second interlayer insulating layer 108. When a portion of the bank insulating layer 400' is etched in a process of forming the bank layer 400_5, a dry etching process may be performed to expose a portion of the upper surface of the second interlayer insulating layer 108. Accordingly, the lower surface of the resultant groove OP_5 may contact the upper surface of the second interlayer insulating layer 108, and a portion of a lower surface of a first insulating layer 510 may directly contact the second interlayer insulating layer 108. In addition, a portion of a lower surface of each of a first electrode 210_5 and a second electrode 220_5 may directly contact the second interlayer insulating layer 108.

In addition, although the lower surface of the groove OP_5 contacts the second interlayer insulating layer 108 in FIG. 23, embodiments are not limited to this case. A portion of the second interlayer insulating layer 108 may also be etched at the same time as the bank insulating layer 400' during the manufacturing process of the display device 10_5. In this case, a light emitting element 300 may be located on substantially the same layer as the second interlayer insulating layer 108, or a second data conductive layer on the second interlayer insulating layer 108. In some embodiments, the light emitting element 300 may overlap the second data conductive layer in a direction parallel to an upper surface of a first substrate 101.

When a material that forms the bank layer 400_5 and a material that forms the second interlayer insulating layer 108 are the same, the lower surface of the groove OP_5 may be formed to have a curved shape as illustrated in FIG. 23, even if a portion of the second interlayer insulating layer 108 is etched in the process of etching the bank insulating layer 400'. The bank insulting layer 400' and the second interlayer insulating layer 108 made of the same material may have the same etch selectivity and may be isotropically etched. However, if the groove OP_5 is formed up to a layer including a different material from that of the bank layer 400_5 in the process of forming the bank layer 400_5, the bank layer 400_5 and the layer (formed of the different material) may have different etch selectivities, and thus the lower surface of the groove OP_5 may form a flat surface without being curved.

Figure 24:
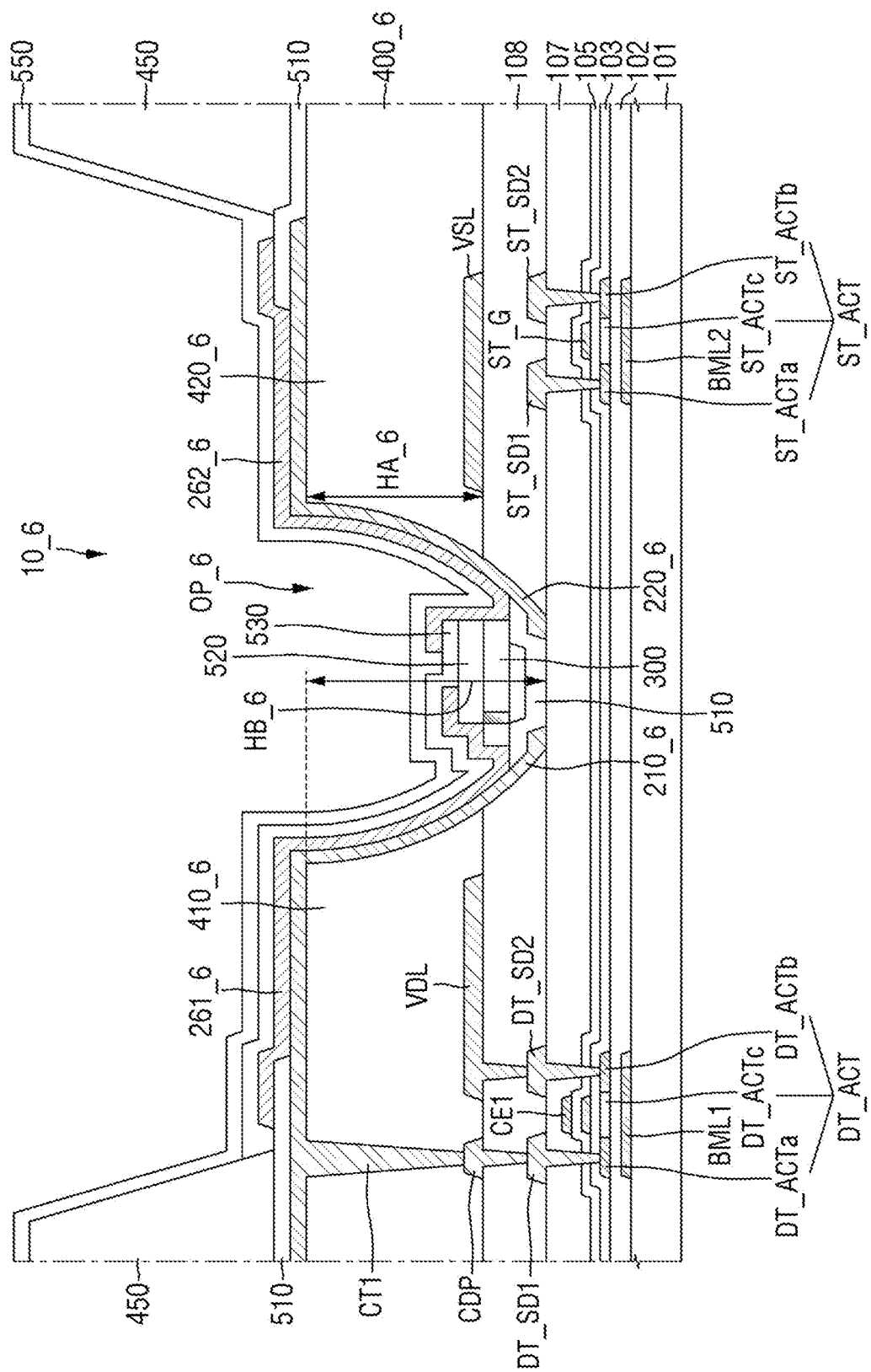
FIG. 24 is a cross-sectional view of a display device according to an embodiment.

FIG. 24 is a cross-sectional view of a display device 10_6 according to an embodiment.

Referring to FIG. 24, in the display device 10_6 according to an embodiment, a groove OP_6 of a bank layer 400_6 may penetrate a second interlayer insulating layer 108 up to an upper surface of a first interlayer insulating layer 107. The current embodiment is different from the embodiment of FIG. 23 in a depth HB_6 of the groove OP_6.

During a manufacturing process of the display device 10_6, if a bank insulating layer 400' and the second interlayer insulating layer 108 include the same material, they may be simultaneously (or concurrently) etched in an etching process for forming the groove OP_6. Accordingly, the groove OP_6 may be formed to penetrate the second interlayer insulating layer 108 up to the upper surface of the first interlayer insulating layer 107. According to an embodiment, the depth HB_6 of the groove OP_6 may be greater than a thickness of the bank layer 400_6 and/or a height HA_6 of each inner bank 410_6 or 420_6. The groove OP_6 may penetrate the second interlayer insulating layer 108 to expose a portion of the upper surface of the first interlayer insulating layer 107, and a portion of a lower surface of a first insulating layer 510 arranged in the groove OP_6 may directly contact the first interlayer insulating layer 107. In addition, a first electrode 210_6 and a second electrode 220_6 may directly contact the first interlayer insulating layer 107. Accordingly, a light emitting element 300 may be located on the same layer as a first data conductive layer, and may be located lower than upper surfaces of the inner banks 410_6 and 420_6. This can further improve the efficiency of concentrating light emitted from the light emitting element 300.

In some embodiments, if the bank layer 400_6 and the first interlayer insulating layer 107 include different materials, they may have different etch selectivities. During the manufacturing process of the display device 10_6, the first interlayer insulating layer 107 may serve as an etch stopper, without being etched in a process of dry-etching the bank insulating layer 400'. Accordingly, the upper surface of the first interlayer insulating layer 107 may form a flat surface, and a lower surface of the groove OP_6 may be formed flat without being curved.

When the depth HB_6 of the groove OP_6 is as large as in the display device 10_6 of FIG. 24, the inner banks 410_6 and 420_6 may function as an outer bank 450 during the manufacturing process of the display device 10_6. That is, the outer bank 450 can be omitted.

Figure 25:
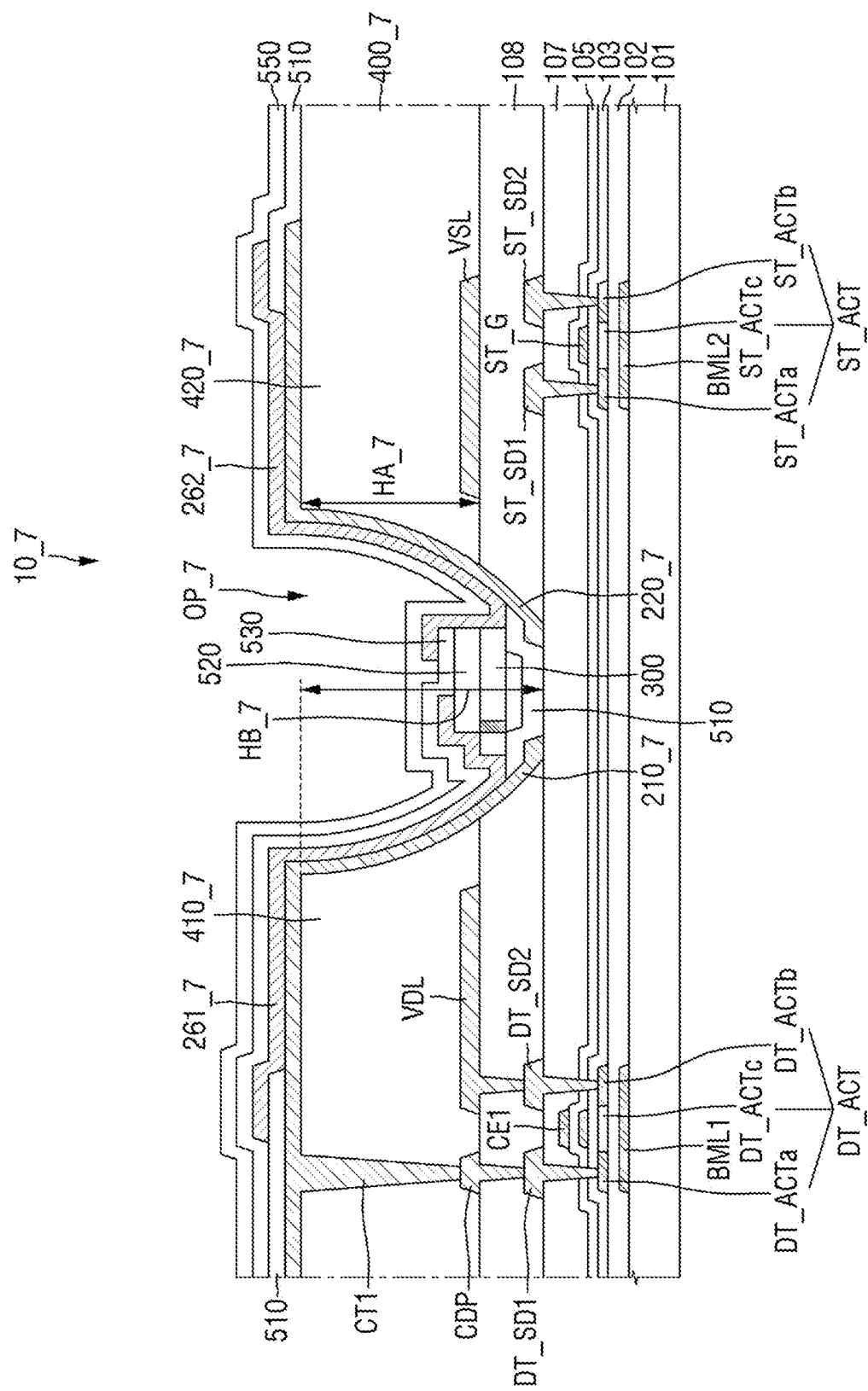
FIG. 25 is a cross-sectional view of a display device according to an embodiment.

FIG. 25 is a cross-sectional view of a display device 10_7 according to an embodiment.

Referring to FIG. 25, the display device 10_7 according to an embodiment may not include an outer bank 450. The current embodiment is different from the embodiment of FIG. 24 in that the outer bank 450 is omitted.

During a manufacturing process of the display device 10_7 of FIG. 25, an ink in which light emitting elements 300 are dispersed may be sprayed onto electrodes 210 and 220. Then, the ink may be located in a groove OP_7 of a bank layer 400_7. When a depth HB_7 of the groove OP_7 is sufficiently large, inner banks 410_7 and 420_7 may prevent or reduce the risk of the ink from overflowing to other subpixels PXn. Accordingly, even if the outer bank 450 is omitted, the light emitting elements 300 can be selectively aligned in each subpixel PXn. Other members are the same as those described above, and thus redundant descriptions thereof will not be provided.

A display device according to an embodiment may include a plurality of inner banks, which are spaced apart to face each other and whose facing side surfaces have a curved (e.g., concave) shape. A plurality of electrodes may be arranged on the inner banks, respectively, and light emitting elements may be positioned between the inner banks and be electrically coupled to each of the plurality of electrodes. The curved side surfaces of the inner banks may be recessed into the inner banks, and light emitted from the light emitting elements may be reflected by the electrodes positioned on the curved side surfaces of the inner banks.

According to an embodiment, the curved side surfaces of the inner banks in the display device may increase the amount of light directed upward after being emitted from the light emitting elements, while also concentrating the light, and may improve the luminous efficiency of each subpixel.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

In concluding the detailed description, those skilled in the art will appreciate that many variations and modifications can be made to the example embodiments without substantially departing from the principles of the present disclosure. Therefore, the disclosed embodiments of the present disclosure are used in a generic and descriptive sense only and not for purposes of limitation.

What is claimed is:

1. A display device comprising:
    a substrate;
    a first inner bank and a second inner bank, each on the substrate, and spaced apart from each other;
    a first electrode on the first inner bank and a second electrode on the second inner bank; and
    a light emitting element between the first inner bank and the second inner bank, the light emitting element being electrically connected to the first electrode and the second electrode,
    wherein the first inner bank comprises a first side surface facing the second inner bank, the second inner bank comprises a second side surface facing the first side surface, and
    the first side surface and the second side surface are respectively recessed into the first inner bank and the second inner bank, to have a curved shape.

2. The display device of claim 1, wherein the first side surface of the first inner bank comprises a first end portion contacting a lower surface of the first inner bank and a second end portion contacting an upper surface of the first inner bank, and
    the first side surface is below a reference line connecting the first end portion and the second end portion.

3. The display device of claim 2, wherein a slope the first side surface varies from the lower surface toward the upper surfaces of the first inner bank, and a slope of the second side surface varies from a lower surface toward an upper surface of the second inner bank.

4. The display device of claim 3, wherein a first inclination angle between the lower surface of the first inner bank and a line tangent to the first end portion is smaller than a second inclination angle between the upper surface of the first inner bank and a line tangent to the second end portion.

5. The display device of claim 4, wherein a sum of the first inclination angle and a fourth inclination angle between the upper surface of the first inner bank and the first side surface is smaller than 180 degrees.

6. The display device of claim 1, wherein the first side surface and the second side surface are respectively recessed toward midpoints of lower portions of the first inner bank and the second inner bank to have a curved shape.

7. The display device of claim 1, further comprising a first planarization layer on the substrate,
wherein the first inner bank and the second inner bank are directly on the first planarization layer.

8. The display device of claim 7, wherein a portion of the first planarization located between the first inner bank and the second inner bank is recessed, and
the display device further comprises a first insulating layer directly on the recessed portion of the first planarization layer.

9. The display device of claim 8, wherein a height of the first inner bank is smaller than a distance from a lower surface of the first insulating layer to an upper surface of the first inner bank.

10. The display device of claim 8, wherein the light emitting element is lower than the lower surface of the first inner bank.

11. The display device of claim 1, further comprising an outer bank spaced apart from the first inner bank and the second inner bank, the outer bank surrounding the first inner bank and the second inner bank,
wherein a height of the outer bank is greater than that of the first inner bank.

12. The display device of claim 11, further comprising:
a first contact electrode contacting an end portion of the light emitting element and the first electrode; and
a second contact electrode contacting another end portion of the light emitting element and the second electrode.

13. A display device comprising:
a first substrate;
a bank layer on the first substrate and comprising a groove formed by recessing at least a portion of the bank layer, and a first inner bank and a second inner bank spaced apart from each other with respect to the groove;
a first electrode on the first inner bank,
a second electrode on the second inner bank; and
a light emitting element in the groove and electrically connected to the first electrode and the second electrode,
wherein a first side surface of the first inner bank and a second side surface of the second inner bank form sides of the groove, and
the first side surface and the second side surface are respectively recessed into the first inner bank and the second inner bank, to have a curved shape.

14. The display device of claim 13, wherein the first side surface of the first inner bank comprises a first end portion contacting a lower surface of the first inner bank and a second end portion contacting an upper surface of the first inner bank, and
the first side surface is below a reference line connecting the first end portion and the second end portion.

15. The display device of claim 14, wherein a depth of the groove is smaller than a height of the first inner bank.

16. The display device of claim 13, further comprising:
a first interlayer insulating layer between the first substrate and the bank layer; and
a second interlayer insulating layer between the first interlayer insulating layer and the bank layer,
wherein the bank layer is directly on the second interlayer insulating layer.

17. The display device of claim 16, wherein the groove penetrates the second interlayer insulating layer to expose an upper surface of the first interlayer insulating layer, and
a depth of the groove is greater than a height of the first inner bank.

18. The display device of claim 17, wherein a lower surface of the groove is flat.

19. The display device of claim 16, wherein a lower surface of the groove contacts an upper surface of the second interlayer insulating layer, and
a depth of the groove is substantially equal to a height of the first inner bank.

20. The display device of claim 17, wherein the light emitting element is located on the same layer as the second interlayer insulating layer.

21. The display device of claim 19, wherein the lower surface of the groove has a curved shape.

22. The display device of claim 13, wherein the first side surface and the second side surface are respectively recessed toward midpoints of lower portions of the first inner bank and the second inner bank, to have a curved shape.

* * * * *